US012652900B2

(12) United States Patent
Takenaka et al.

(10) Patent No.: US 12,652,900 B2
(45) Date of Patent: Jun. 9, 2026

(54) METHOD FOR MANUFACTURING EL ELEMENT, AND EL ELEMENT

(71) Applicant: SHARP KABUSHIKI KAISHA, Sakai City (JP)

(72) Inventors: Yukio Takenaka, Sakai City (JP); Yuma Yaguchi, Sakai City (JP)

(73) Assignee: SHARP KABUSHIKI KAISHA, Sakai City (JP)

(*) Notice: Subject to any disclaimer, the term of this patent is extended or adjusted under 35 U.S.C. 154(b) by 366 days.

(21) Appl. No.: 18/277,273

(22) PCT Filed: Mar. 9, 2021

(86) PCT No.: PCT/JP2021/009201
§ 371 (c)(1),
(2) Date: Aug. 15, 2023

(87) PCT Pub. No.: WO2022/190194
PCT Pub. Date: Sep. 15, 2022

(65) Prior Publication Data

US 2024/0147826 A1 May 2, 2024

(51) Int. Cl.
*H10K 50/115* (2023.01)
*H10K 59/35* (2023.01)
(Continued)

(52) U.S. Cl.
CPC ........... *H10K 50/115* (2023.02); *H10K 59/35* (2023.02); *H10K 71/12* (2023.02); *H10K 59/1201* (2023.02)

(58) Field of Classification Search
None
See application file for complete search history.

(56) References Cited

U.S. PATENT DOCUMENTS

2018/0294414 A1 10/2018 Mei et al.
2019/0207136 A1 7/2019 Chen et al.

FOREIGN PATENT DOCUMENTS

CN 106206972 A 12/2016
CN 109935739 A 6/2019
JP 2020-161442 A 10/2020

OTHER PUBLICATIONS

Fan Xu et al., "Impact of Different Surface Ligands on the Optical Properties of PbS Quantum Dot Solids", Materials 2015, 8, 1858-1870; doi:10.3390/ma8041858, Published: Apr. 21, 2015.

(Continued)

*Primary Examiner* — Anthony Ho
(74) *Attorney, Agent, or Firm* — ScienBiziP, P.C.

(57) ABSTRACT

A method for manufacturing an EL element, includes: a first quantum dot layer forming step of forming a quantum dot layer containing first quantum dots; a first quantum dot layer coating step of exposing a first portion included in the first quantum dot layer, and coating a second portion included in the first quantum dot layer, the first quantum dot layer coating step including: a photoresist layer forming step; and a photoresist layer patterning step; a solution supplying step of applying or spraying a solution only to or on the first portion, the solution containing first molecules each having a plurality of coordinating functional groups coordinatable with the first quantum dots and; a removing step of removing the second portion of the first quantum dot layer and the patterned photoresist layer, such that the first portion of the first quantum dot layer forms a first light-emitting layer.

20 Claims, 28 Drawing Sheets

(51) Int. Cl.
*H10K 71/12* (2023.01)
*H10K 59/12* (2023.01)

(56) References Cited

OTHER PUBLICATIONS

Wenhai Mei et al., "High-resolution, full-color quantum dot light-emitting diode display fabricated via photolithography approach", https://doi.org/10.1007/s12274-020-2883-9, Accepted: May 17, 2020.
Chun Hao Lin et al., "Large-Area Lasing and Multicolor Perovskite Quantum Dot Patterns", DOI: 10.1002/adom.201800474, First published: May 30, 2018.

METHOD FOR MANUFACTURING EL ELEMENT, AND EL ELEMENT

TECHNICAL FIELD

The disclosure relates to a method for manufacturing an electro-luminescent (EL) element and an EL element.

BACKGROUND ART

Non-Patent Document 1 relates to a solar cell. Non-Patent Document 1 describes a method for ligand exchange that involves depositing a PbS quantum dot (QD) film and immersing the film in a solution containing dithiol ligands. Non-Patent Document 1 describes that the ligand exchange changes a distance between QDs, and that repetition of the film deposition and the ligand exchange can increase a thickness of a QD layer.

Non-Patent Document 2 relates to a quantum dot light-emitting diode (QLED) display. Non-Patent Document 3 relates to patterning of perovskite QDs. Each of Non-Patent Documents 2 and 3 describes a method for patterning a photoresist and a sacrificial layer by photolithography, and patterning a QD layer using the patterned sacrificial layer as a cavity.

CITATION LIST

Non-Patent Literatures

[Non-Patent Document 1] "Impact of Different Surface Ligands on the Optical Properties of PbS Quantum Dot Solids" Materials 2015. 8. 1858 to 1870.

[Non-Patent Document 2] "High-resolution, full-color quantum dot light-emitting diode display fabricated via photolithography approach" Nano Research 2020. 13. 2485 to 2491.

[Non-patent Document 3] "Large-Area Lasing and Multicolar Perovskite Quantum Dot Patterns" Adv. Optical Mater. 2018. 6. 1800474.

SUMMARY

Technical Problem

Non-Patent Document 1 neither discloses nor suggests patterning of the QD layer. Non-Patent Documents 2 and 3 disclose methods for pattering the QD layers using cavities.

However, the methods described in Non-Patent Documents 2 and 3 have a problem; that is, the patterned QD layer is not flat because the patterned sacrificial layer has a depressing portion, and, on a wall surface of the depressing portion, a QD solution dries as the QD solution is wet. Specifically, the problem is that the patterned QD layer is thin in a center portion and thick in an end portion.

Solution to Problem

In order to solve the above problem, a method for manufacturing an EL element according to the present disclosure includes: a first quantum dot layer forming step of forming a quantum dot layer containing first quantum dots; a first quantum dot layer coating step of exposing a first portion included in the first quantum dot layer, and coating a second portion included in the first quantum dot layer other than the first portion, the first quantum dot layer coating step including: a photoresist layer forming step of forming, on the first quantum dot layer, a photoresist layer including a photoresist; and a photoresist layer patterning step of partially exposing the photoresist layer with light, developing the photoresist layer, and patterning the photoresist layer; a solution supplying step of applying or spraying a solution only to or on the first portion of the first quantum dot layer, the solution containing first molecules each having a plurality of coordinating functional groups coordinatable with the first quantum dots and; a removing step of removing the second portion of the first quantum dot layer and the patterned photoresist layer, such that the first portion of the first quantum dot layer forms a first light-emitting layer.

In order to solve the above problem, an EL element according to the present disclosure includes: a first light-emitting layer that emits light in a first color in a first direction; and a second light-emitting layer positioned in a second direction intersecting with the first direction with respect to the first light-emitting layer, the second light-emitting layer emitting light in a second color in the first direction. The first light-emitting layer contains: first quantum dots that emit the light in the first color; and molecules each having a plurality of coordinating functional groups coordinatable with the first quantum dots. The second light-emitting layer contains: second quantum dots that emit the light in the second color; and molecules each having a plurality of coordinating functional groups coordinatable with the second quantum dots.

Advantageous Effect of Disclosure

An aspect of the present disclosure can reduce a difference in thickness between a center portion and an end portion of a patterned QD layer.

DESCRIPTION OF EMBODIMENTS

First Embodiment

Manufacturing Method for, and Configuration of, Display Device

In the description below, the term "same layer" means that constituent features are formed in the same process (in the same film forming process). The term "below" means that a constituent feature is formed in a previous process before a comparative layer. The term "above" means that a constituent feature is formed in a successive process after a comparative layer.

Figure 1:
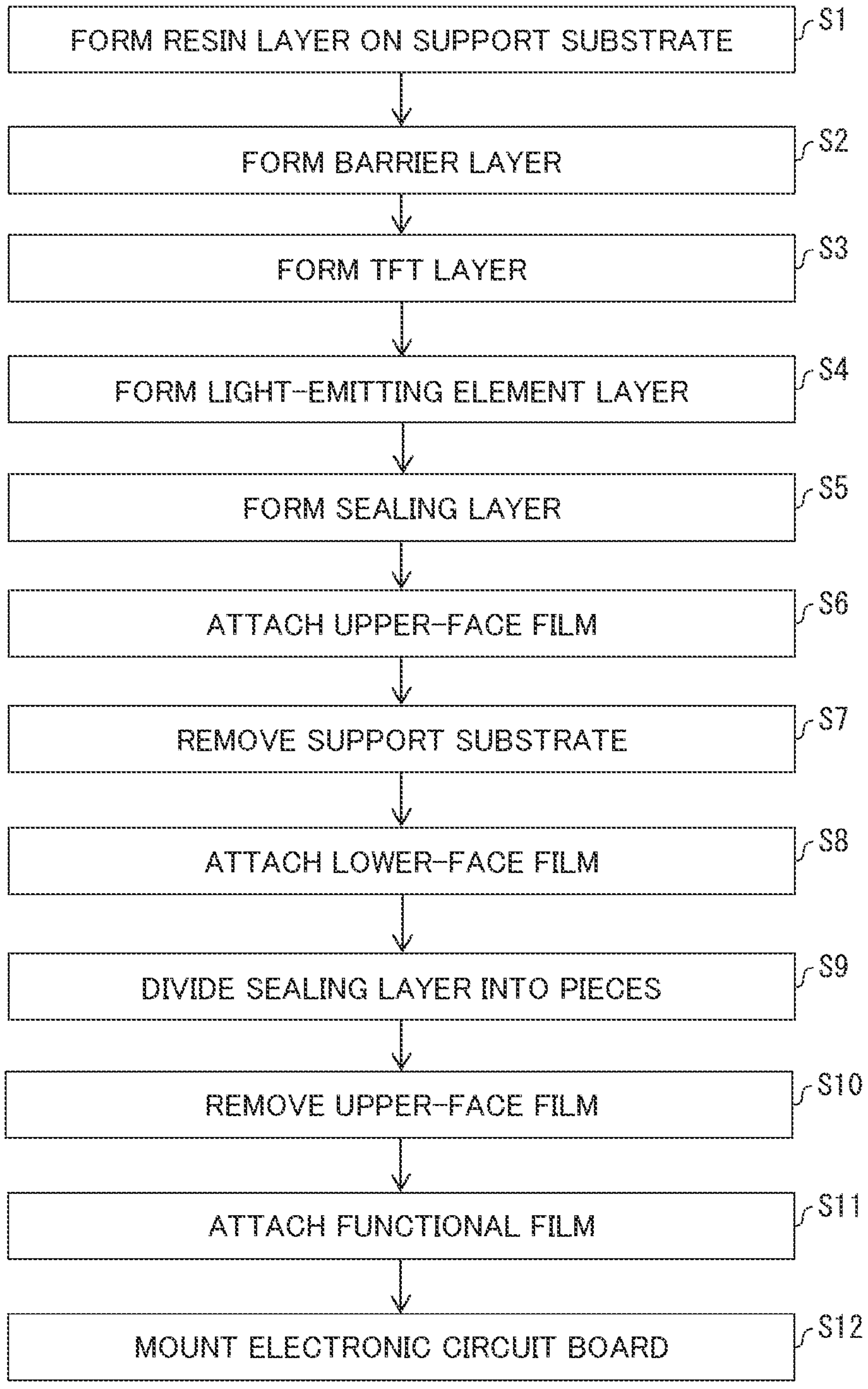
FIG. 1 is a flowchart showing an exemplary method for manufacturing a display device according to embodiments of the disclosure.
Figure 2:
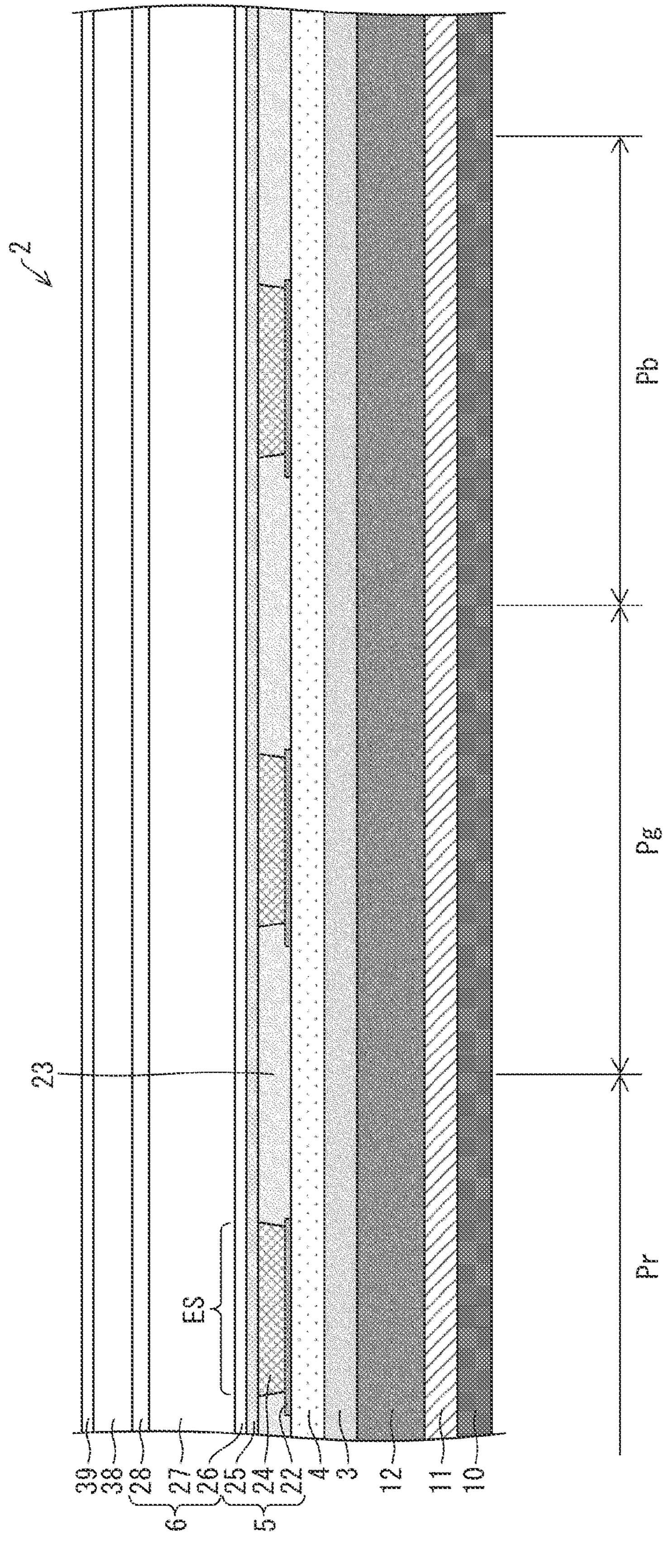
FIG. 2 is a schematic cross-sectional view of an exemplary configuration of a display region of the display device according to embodiments of the disclosure.

FIG. 1 is a flowchart showing an exemplary method for manufacturing a display device. FIG. 2 is a schematic cross-sectional view of an exemplary configuration of a display region of a display device 2.

When the flexible display device 2 to be manufactured is flexible, as shown in FIGS. 1 and 2, first, a resin layer 12 is formed on a light-transparent support substrate (e.g., a mother glass) (Step S1). Next, a barrier layer 3 is formed (Step S2). Next, a thin-film transistor layer 4 (a TFT layer) is formed (Step S3). Next, a light-emitting element layer 5 of a top-emission type is formed (Step S4). Next, a sealing layer 6 is formed (Step S5). Next, an upper-face film is attached to the sealing layer 6 through an adhesive layer (Step S6).

Next, the support substrate is removed from the resin layer 12 with, for example, a laser beam emitted on the support substrate (Step S7). Next, a lower-face film 10 is attached to a lower surface of the resin layer 12 through an adhesive layer 11 (Step S8). Next, a multilayer stack including the lower-face film 10, the adhesive layer 11, the resin layer 12, the barrier layer 3, the thin-film transistor layer 4, the light-emitting element layer 5, and the sealing layer 6 is divided into a plurality of pieces together with the upper-face film. Thus, a plurality of pieces are obtained. (Step S9). Next, the upper-face film is removed from each of the obtained pieces (Step S10). A functional film 39 is attached to the sealing layer 6 of the piece through an adhesive layer 38 (Step S11). Next, an electronic circuit board (e.g., an IC chip and an FPC) is mounted on a portion (a terminal unit) of a picture-frame region (a non-display region) surrounding a display region in which a plurality of subpixels are formed (Step S12). Note that Steps S1 to S12 are carried out on a display device manufacturing apparatus (including a deposition apparatus that carries out each of Steps S1 to S5).

The light-emitting element layer 5 includes: an anode 22 (an anode; namely, a pixel electrode) above a planarization film 21; an edge cover 23 insulative and covering an edge of the anode 22; an active layer 24 that is an electroluminescence (EL) layer above the edge cover 23; and a cathode 25 (a cathode; namely, a common electrode) above the active layer 24.

For each of the subpixels, a light-emitting element ES (an electroluminescent element); namely, a QLED, is formed in the light-emitting element layer 5. The light-emitting element ES includes: the anode 22 shaped into an island; the active layer 24; and the cathode 25. A subpixel circuit is formed in the thin-film transistor layer 4 to control the light-emitting element ES.

The sealing layer 6 is transparent to light, and includes: an inorganic sealing film 26 covering the cathode 25; an organic buffer film 27 above the inorganic sealing film 26; and an inorganic sealing film 28 above the organic buffer film 27. The sealing layer 6 covering the light-emitting element layer 5 prevents foreign substances such as water and oxygen from penetrating into the light-emitting element layer 5.

Described above is a flexible display device. In the case where a non-flexible display device is manufactured, such typical works as formation of the resin layer and replacement of a base material are unnecessary. Hence, for example, the glass substrate is subjected to stacking steps of Steps S2 to S5. After that, the process proceeds to Step S9. In the case of manufacturing a non-flexible display device, instead of or in addition to the formation of the sealing layer 6, a light-transparent sealing member may be bonded with a sealing adhesive under a nitrogen atmosphere. The light-transparent sealing member can be formed of such materials as glass and plastic. Preferably, the material is shaped into a concave shape.

This first embodiment and the second to fourth embodiments to be described later relate to, in particular, a step of forming the light-emitting element layer 5 (Step S4) in the above-described method for manufacturing the display device. This first embodiment relates to, in particular, the active layer 24 in the configuration of the display device described above.

Configuration of Light-Emitting Element Layer

Figure 3:
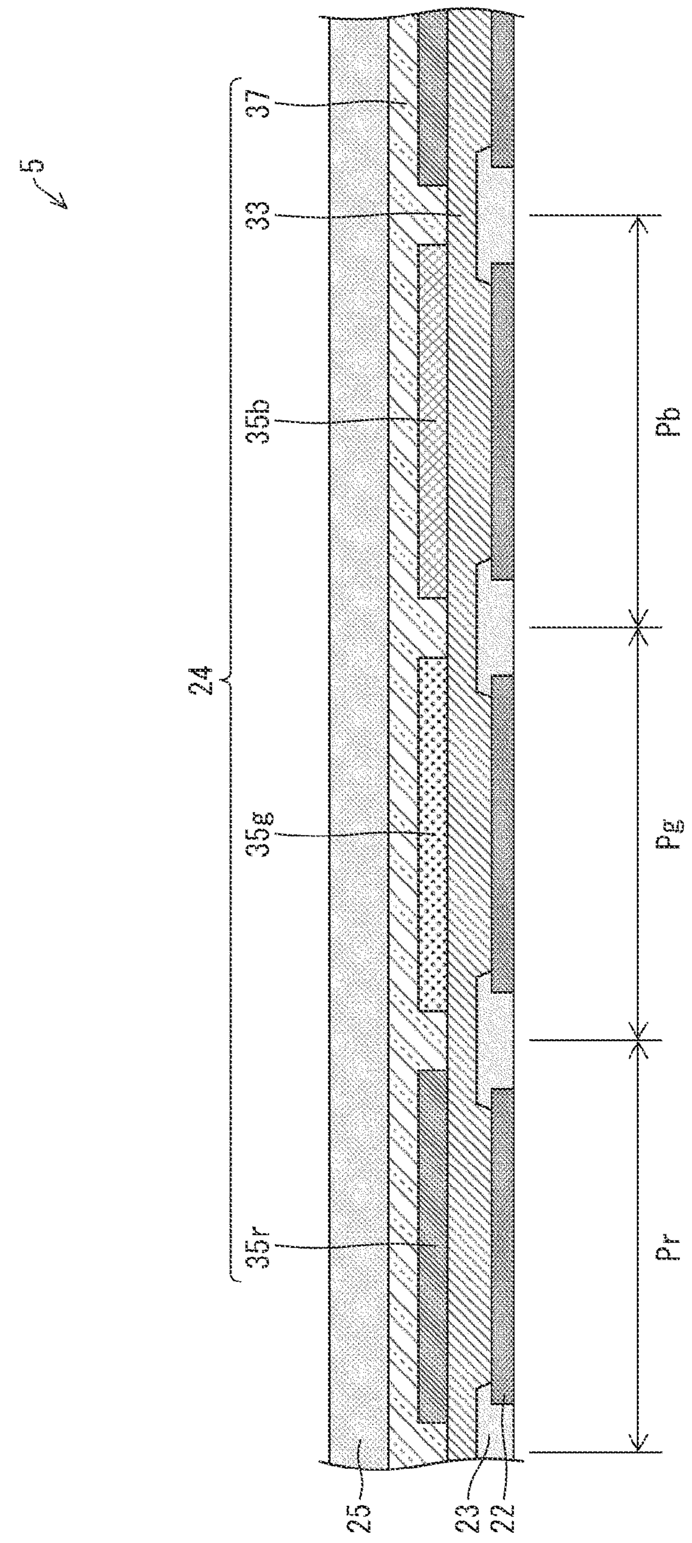
FIG. 3 is a schematic cross-sectional view of an exemplary configuration of a light-emitting element layer of the display device according to embodiments of the disclosure.
Figure 4:
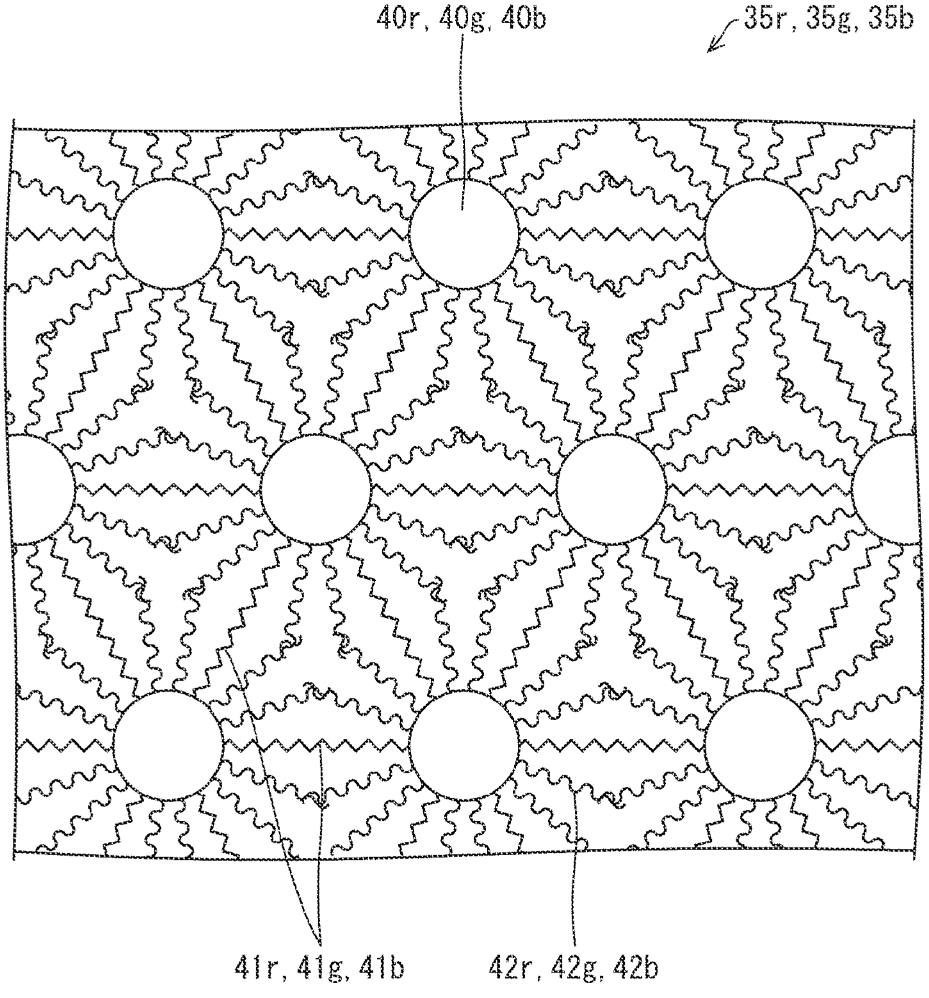
FIG. 4 is a schematic diagram illustrating an exemplary configuration of a light-emitting layer illustrated in FIG. 3.
Figure 5:
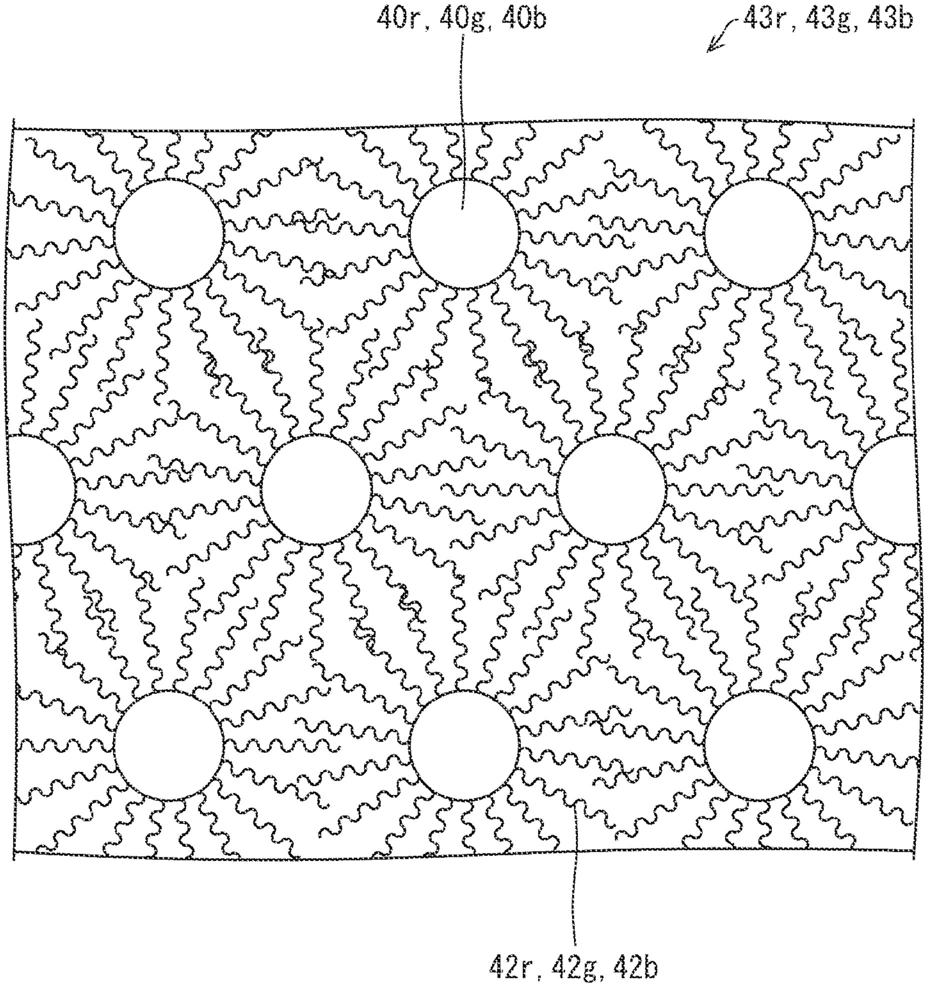
FIG. 5 is a schematic diagram illustrating an exemplary configuration of a QC layer, showing as an example the configuration illustrated in FIG. 4 before ligand exchange.

FIG. 3 is a schematic cross-sectional view of an exemplary configuration of the light-emitting element layer 5 of the display device 2 according to this first embodiment and the second to the fourth embodiments. FIG. 4 is a schematic diagram illustrating an exemplary configuration of each of a red light-emitting layer **35*r* (a first light-emitting layer), a green light-emitting layer 35*g* (a second light-emitting layer), and a blue light-emitting layer 35*b* illustrated in FIG. 3. FIG. 5 is a schematic diagram illustrating an exemplary configuration of each of a red QC layer 43*r* (a first quantum dot layer), a green QD layer 43*g* (a second quantum dot layer), and a blue QD layer 43*b*, showing as an example the configuration illustrated in FIG. 4** before ligand exchange.

In this Description, the term "ligand" refers to a molecule or an ion coordinatable with a quantum dot contained in a quantum dot layer. Furthermore, the "ligand" also includes not only a molecule or an ion actually bonding to a surface of a quantum dot, but also a molecule or an ion capable of boding to, but not yet boding to, a surface of a quantum dot.

As illustrated in FIG. 3, the light-emitting element layer 5 includes: a red subpixel Pr that emits a red light; a green subpixel Pg that emits a green light; and a blue subpixel Pb that emits a blue light. Hereinafter, each of the red subpixel Pr, the green subpixel Pg, and the blue subpixel Pb is collectively referred to as a "subpixel P". Each subpixel P emits light in a direction opposite to (toward the top of FIG. 3) the substrate (i.e., the lower-face film 10 or a mother glass 70 to be described later). The subpixels P may be arranged in any given manner such as a PenTile Matrix or a stripe.

As illustrated in FIG. 3, the light-emitting element layer 5 includes: the anode 22; the edge cover 23; the active layer 24; and the cathode 25.

The active layer 24 includes: a hole transport layer 33; the red light-emitting layer **35*r* corresponding to the red subpixel Pr, the green light-emitting layer 35*g* corresponding to the green subpixel Pg; the blue light-emitting layer 35*b* corresponding to the blue subpixel Pb; and an electron transport layer 37. The red light-emitting layer 35*r*, the green light-emitting layer 35*g*, and the blue light-emitting layer 35*b* are provided between the hole transport layer 33 and the electron transport layer 37. In this Description, each of the red light-emitting layer 35*r*, the green light-emitting layer 35*g*, and the blue light-emitting layer 35*b* is collectively referred to as a "light-emitting layer 35". The active layer 24** may optionally include such not-shown layers as an electron blocking layer, a hole injection layer, an electron injection layer, a hole blocking layer, and a wavelength converting layer.

The hole transport layer 33 contains a hole-transporting material.

The electron transport layer 37 contains an electron-transporting material.

Each of the light-emitting layers 35 emits light in a direction to the substrate (toward the bottom of FIG. 3; namely, a first direction), and in a direction opposite to the substrate (toward the top of FIG. 3; namely, the first direction). The light emitted in the direction to the substrate is reflected on the anode 22, and travels in the direction opposite to the substrate. The light-emitting layers 35 are positioned with respect to one another in a direction in parallel with an upper surface of the substrate (a horizontal direction in FIG. 3; namely, a second direction). That is, the green light-emitting layer **35*g* and the blue light-emitting layer 35*b* are arranged in the second direction with respect to the red light-emitting layer 35*r*. The blue light-emitting layer 35*b* is also disposed in the second direction with respect to the green light-emitting layer 35*g*. Thanks to this arrangement, the red light-emitting layer 35*r*, the green light-emitting layer 35*g*, and the blue light-emitting layer 35*b*** are positioned in the second direction with respect to one another. Here, the direction in parallel with the upper surface of the substrate intersects with the direction of the substrate and the direction opposite to the substrate.

The above described light-emitting layers 35 can be formed by patterning the QD layers formed entirely over the substrate. Hence, application of the present disclosure is beneficial. Note that a scope of application of the present disclosure shall not be limited to the above application. For example, the present disclosure is applicable to a configuration in which the light-emitting layers are positioned with respect to one another in a direction perpendicular to the upper surface of the substrate (the first direction).

The light-emitting layers 35 may be in contact with, or separated from, one another.

Configuration of Light-Emitting Layer

FIG. 4 is a schematic diagram illustrating an exemplary configuration of each of the red light-emitting layer **35*r*, the green light-emitting layer 35*g*, and the blue light-emitting layer 35*b* illustrated in FIG. 3. FIG. 5 is a schematic diagram illustrating an exemplary configuration of each of the red QD layer 43*r*, the green QD layer 43*g*, and the blue QD layer 43*b***, all of which are not cured.

As illustrated in FIG. 4, the red light-emitting layer **35*r* contains at least: red QDs 40*r* (first quantum dots); and first red ligands 41*r* (first molecules, molecules, or coordinatable molecules). The red light-emitting layer 35*r* may optionally contain second red ligands 42*r* (second molecules). Likewise, the green light-emitting layer 35*g* contains at least: green QDs 40*g* (second quantum dots); and first green ligands 41*g* (molecules, or coordinatable molecules), and may optionally contain second green ligands 42*g*. Likewise, the blue light-emitting layer 35*b* contains at least: blue QDs 40*b*; and first blue ligands 41*b*, and may optionally contain second blue ligands 42*b***.

The red light-emitting layer **35*r* illustrated in FIG. 4 is obtained when the red QD layer 43*r* illustrated in FIG. 5 proceeds with ligand exchange in which the second red ligands 42*r* are partially exchanged for the first red ligands 41*r*. The red QD layer 43*r* illustrated in FIG. 5 contains the red QDs 40*r* and the second red ligands 42*r*, but not the first red ligands 41$r$. The red QD layer 43$r$ illustrated in FIG. 5 is formed of a solution containing the red QDs 40$r$, the second red ligands 42$r$, and a solvent. The solvent is volatilized, such that the red QD layer 43**$r$ is obtained. The solvent is preferably a volatile nonpolar solvent such as hexane, octane, toluene, xylene or chlorobenzene.

Likewise, the green light-emitting layer 35$g$ is obtained when the green QD layer 43$g$ proceeds with ligand exchange. The green QD layer 43$g$ contains the green QDs 40$g$ and the second green ligands 42$g$, but not the first green ligands 41$g$. Likewise, the blue light-emitting layer 35$b$ is obtained when the blue QD layer 43$b$ proceeds with ligand exchange. The blue QD layer 43$b$ contains the blue QDs 40$b$ and the second blue ligands 42$b$, but not the first blue ligands 41$b$.

Hereinafter, the red QDs 40$r$, the green QDs 40$g$, and the blue QDs 40$b$ are collectively referred to as "QDs 40". Furthermore, the first red ligands 41$r$, the first green ligands 41$g$, and the first blue ligands 41$b$ are collectively referred to as "first ligands 41". Moreover, the second red ligands 42$r$, the second green ligands 42$g$, and the second blue ligands 42$b$ are collectively referred to as "second ligands 42". Each of the red QD layer 43$r$, the green QD layer 43$g$, and the blue QD layer 43$b$ is collectively referred to as a "QD layer 43".

(QDs)

The red QDs 40$r$ are nanoparticles that emit a red light (or light whose wavelength is converted such that the light appears red). The green QDs 40$g$ are nanoparticles that emit a green light (or light whose wavelength is converted such that the light appears green). The blue QDs 40$b$ are nanoparticles that emit a blue light (or light whose wavelength is converted such that the light appears blue).

Each of the red QDs 40$r$, the green QDs 40$g$, and the blue QDs 40$b$ may have any given configuration such as core-shell QDs or core-multishell QDs. For embodiments or aspects of the disclosure, the terms "quantum dots" and "QDs" mean nanoparticles, and do not include ligands coordinated with the nanoparticles. Furthermore, the "quantum dots" and "QDs" mean particles each having a maximum width of 1 nm or more and 100 nm or less. The quantum dots may have any given shape as long as the maximum width is within the above range, and the shape of the quantum dots shall not be limited to a spherical shape (a circular cross-section). For example, the quantum dots may have a polygonal shape in cross-section, a bar-like shape, a branch-like shape, or asperities on the surface. Alternatively, the quantum dots may have a combination of such shapes.

First Ligands

The first red ligands 41$r$ are molecules each having a plurality of coordinating functional groups coordinatable with the red QDs 40$r$. Likewise, the first green ligands 41$g$ are molecules each having a plurality of coordinating functional groups coordinatable with the green QDs 40$g$. Likewise, the first blue ligands 41$b$ are molecules each having a plurality of coordinating functional groups coordinatable with the blue QDs 40$b$. The first ligands 41 have a molecular weight of preferably 1000 or less. This is because, if the molecular weight of the first ligands 41 is excessively high, the first ligands 41 have difficulty moving below the QD layer 43, together with the solvent.

As described above, the first ligands 41 each have a plurality of coordinating functional groups. Such a feature makes it possible to form the light-emitting layer 35 in a manner that a difference in thickness of the light-emitting layer 35 is small between a center portion and an end portion of the light-emitting layer 35. The step of forming the light-emitting layer 35 (that is, the step of patterning the QD layer 43) will be described later.

Each of the coordinating functional groups of the first red ligands 41$r$, the first green ligands 41$g$, and the first blue ligands 41$b$ is one or more selected from the group consisting of a carboxyl group, a thiol group, an amino group, a phosphine group, and a phosphine oxide group. Each coordinating functional group is preferably a thiol group. This is because the thiol group readily coordinates with QDs 40, and continues to coordinate in stability. Examples of the first ligands 41 include 2,2'-(Ethylenedioxy)diethanethiol and 1,2-Ethanedithiol.

The first red ligands 41$r$ are selected so that a surface-to-surface distance is preferably 0.5 nm or more and 3 nm or less between the red QDs 40$r$ bonding together through the first red ligands 41$r$.

Here, the surface-to-surface distance between the QDs 40 is a value obtained by subtracting a number base mean diameter of the QDs 40 from a mean QD center-to-center distance of the QDs 40. The mean QD center-to-center distance of QDs 40 can be measured, utilizing small-angle X-ray scattering of a film containing the QDs 40, or using a transmission electron microscope (TEM). Specifically, the center-to-center distance is measured for multiple pairs of QDs 40 on the basis of a TEM image. Here, the QDs 40 in each pair are adjacent to each other. The mean QD center-to-center distance of the QDs 40 indicates a median value of the values measured for 10 to 50 particles selected at random. Each of the measured values indicates a distance between a center of a QD 40 and a center of another QD 40 included in a plurality of QDs 40 adjacent to the QD 40 and positioned closest to the QD 40. The number base mean diameter of the QDs 40 can be measured, using the TEM. Specifically, the cross-sectional areas of the plurality of QDs 40 are measured on the basis of the TEM image, and diameters are calculated of perfect circles each having the same area as a corresponding one of the cross-sectional areas. The number base mean diameter of the QDs 40 indicates a median value of these diameters, that is, the diameter of QDs 40 (semiconductor nanoparticles) at an integrated value of 50% in the particle size distribution.

Alternatively, if the measurement is difficult with the above-described technique, a mean QD surface-to-surface distance may be measured as the surface-to-surface distance between the QDs 40. The mean QD surface-to-surface distance between the QDs 40 indicates a median value of the values measured for 10 to 50 particles selected at random. Each of the measured value indicates a shortest distance between a surface of a QD 40 and a surface of another QD 40 included in a plurality of QDs 40 adjacent to the QD 40 and positioned closest to the QD 40.

In either case, using a natural number N, N particles are selected at random from a single TEM image containing 2N or more QDs 40.

Likewise, the first green ligands 41$g$ are selected so that the surface-to-surface distance is preferably 0.5 nm or more and 3 nm or less between the green QDs 40$g$ bonding together through the first green ligands 41$g$. Likewise, the first blue ligands 41$b$ are selected so that the surface-to-surface distance is preferably 0.5 nm or more and 3 nm or less between the blue QDs 40$b$ bonding together through the first blue ligands 41$b$.

Specifically, if the first ligands 41 contain thiol groups as a plurality of coordinating functional groups, the thiol groups bond together preferably through two or more carbons. This is because, if the surface-to-surface distance between the QDs 40 is excessively short, the QDs 40 are easily deactivated. Furthermore, if the surface-to-surface distance between the QDs 40 is excessively long, carriers (the electrons or the holes) have difficulty in moving between the QDs 40. If the surface-to-surface distance between the QDs 40 exceeds 3 nm, the carriers have difficulty in hopping conduction between the QDs 40.

The first red ligands 41*r*, the first green ligands 41*g*, and the first blue ligands 41*b* may be independent from one another, and may be either nonpolar ligands or polar ligands. The first ligands 41 are coordinated with the QDs 40, using a plurality of coordinating functional groups. That is why the first ligands 41, which are coordinated with the QDs 40 in a coordination state, are less likely to transfer to a free state in which the first ligands are free and dispersed in the solvent. Hence, regardless of whether the first ligands 41 are either nonpolar ligands or polar ligands, the light-emitting layer 35 is less soluble both in a nonpolar solvent and in a polar solvent.

In Description of the present application, the "nonpolar ligands" mean ligands that have (i) high polarity in the free state in which the ligands are not coordinated with the QDs because of the polarity of the coordinating functional groups. Whereas, the "nonpolar ligands" mean ligands that have (ii) low polarity or no polarity in the coordination state in which the ligands are coordinated with the QDs using the coordinating functional groups, because the polarity of the coordinating functional groups is cancelled by the QDs.

In contrast, in Description of the present application, the "polar ligands" mean ligands that have (i) high polarity in the free state in which the ligands are not coordinated with the QDs because of the polarity of the coordinating functional groups. Whereas, the "polar ligands" mean ligands that have (ii) high polarity even in the coordination state in which the ligands are coordinated with the QDs using the coordinating functional groups.

Second Ligands

The second red ligands 42*r* are molecules each having only one coordinating functional group coordinatable with the red QDs 40*r*. Likewise, the second green ligands 42*g* are molecules each having only two coordinating functional groups coordinatable with the green QDs 40*g*. Likewise, the second blue ligands 42*b* are molecules each having only two coordinating functional groups coordinatable with the blue QDs 40*b*.

The coordinating functional groups of the second red ligands 42*r*, the second green ligands 42*g*, and the second blue ligands 42*b* are independent from one another. Each of the coordinating functional groups is one or more selected from the group consisting of a carboxyl group, a thiol group, an amino group, a phosphine group, and a phosphine oxide group. The second ligands 42 are made of such substances as oleic acid, dodecanoic acid, dodecanethiol, dodecylamine, trioctylphosphine, and trioctylphosphine oxide.

The second red ligands 42*r*, the second green ligands 42*g*, and the second blue ligands 42*b* may be independent from one another, and may be either nonpolar ligands or polar ligands. The second ligands 42 are coordinated with the QDs 40, each using only one coordinating functional group. That is why the second ligands 42 are less likely to transfer from the coordination state to the free state. Hence, if the first ligands 41 are nonpolar ligands, the QD layer 43 is soluble in a nonpolar solvent and less soluble in a polar solvent. Whereas, if the first ligands 41 are polar ligands, the QD layer 43 is soluble in a polar solvent and less soluble in a nonpolar solvent.

Manufacturing Method

Described below in detail with reference to FIGS. 3 to 19 will be exemplary steps of forming an example of the light-emitting element layer 5 in FIG. 3 on a substrate (Step S4; namely, a light-emitting element forming step) in the method for manufacturing the display device 2.

Figure 6:
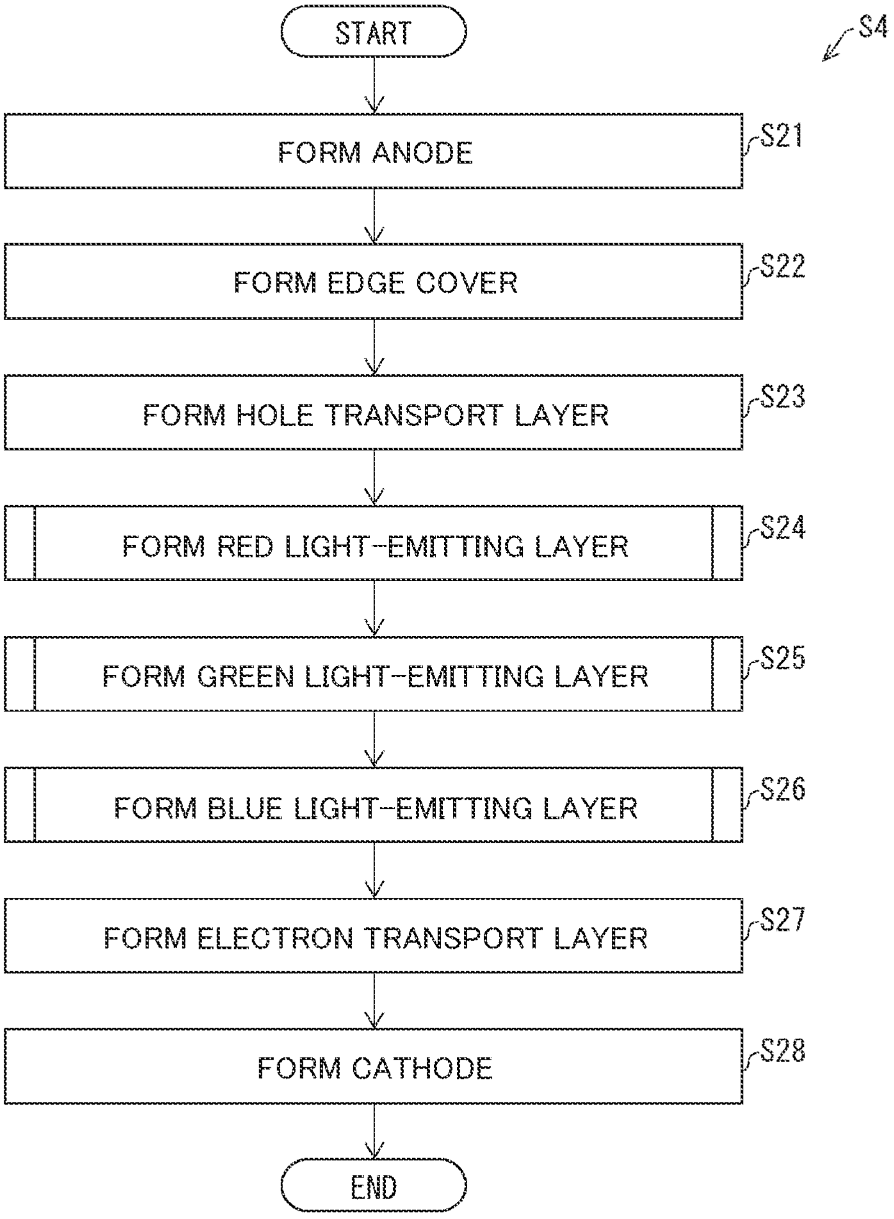
FIG. 6 is a schematic flowchart showing an exemplary step of forming the light-emitting element layer according to embodiments of the disclosure.
Figure 7:
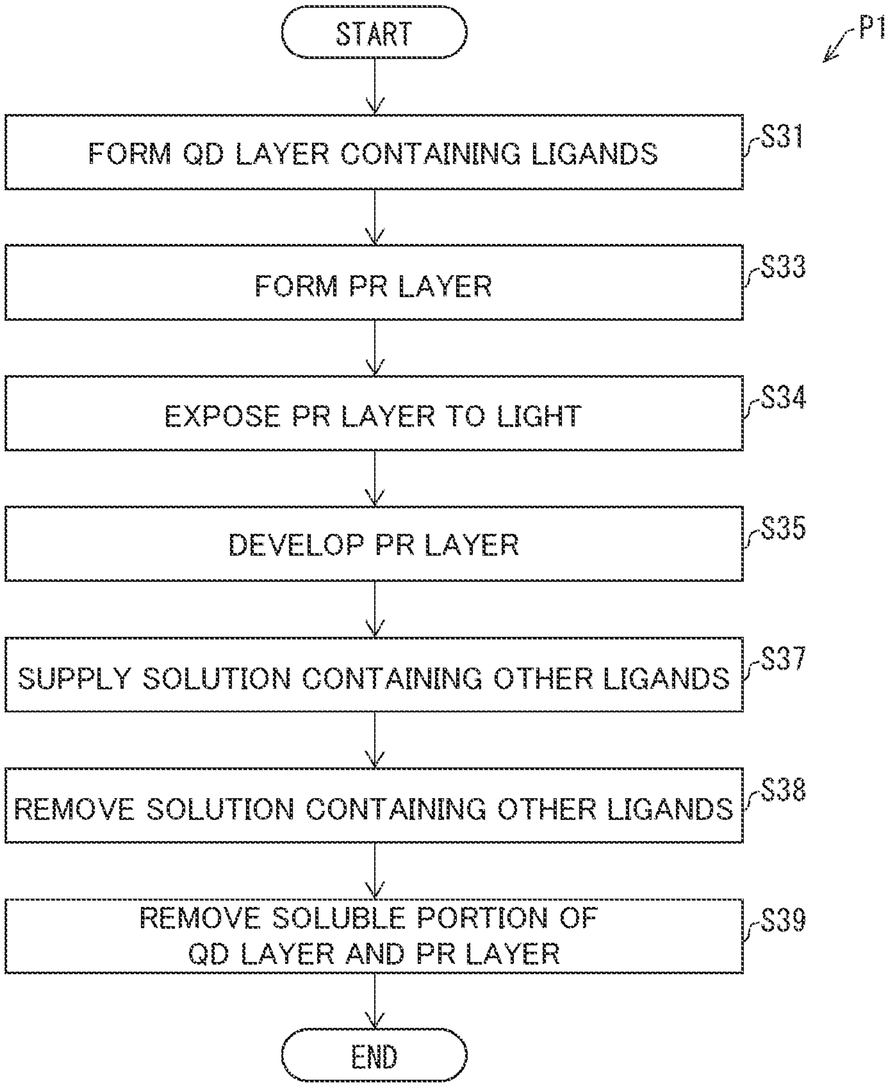
FIG. 7 is a schematic flowchart illustrating processing carried out at each of the steps of forming the light-emitting layer illustrated in FIG. 6.

FIG. 6 is a schematic flowchart showing an exemplary step of forming the light-emitting element layer 5 (Step S4) according to the first embodiment and the second to fourth embodiments to be described later. FIG. 7 is a schematic flowchart illustrating processing P1 carried out at each of a step of forming the red light-emitting layer 35*r* (Step S24), a step of forming the green light-emitting layer 35*g* (Step S25), and a step of forming the blue light-emitting layer 35*b* (Step S26). These steps are shown in FIG. 6.

Each of FIGS. 8 to 19 is a schematic cross-sectional view of an exemplary step of forming the light-emitting element layer 5 (Step S4) according to the first embodiment.

First, the above Steps S1 to S3 (see FIG. 1) are carried out to prepare a substrate having the resin layer 12, the barrier layer 3, and the thin-film transistor layer 4 formed in the stated order on the mother glass 70 (the substrate).

Figure 8:
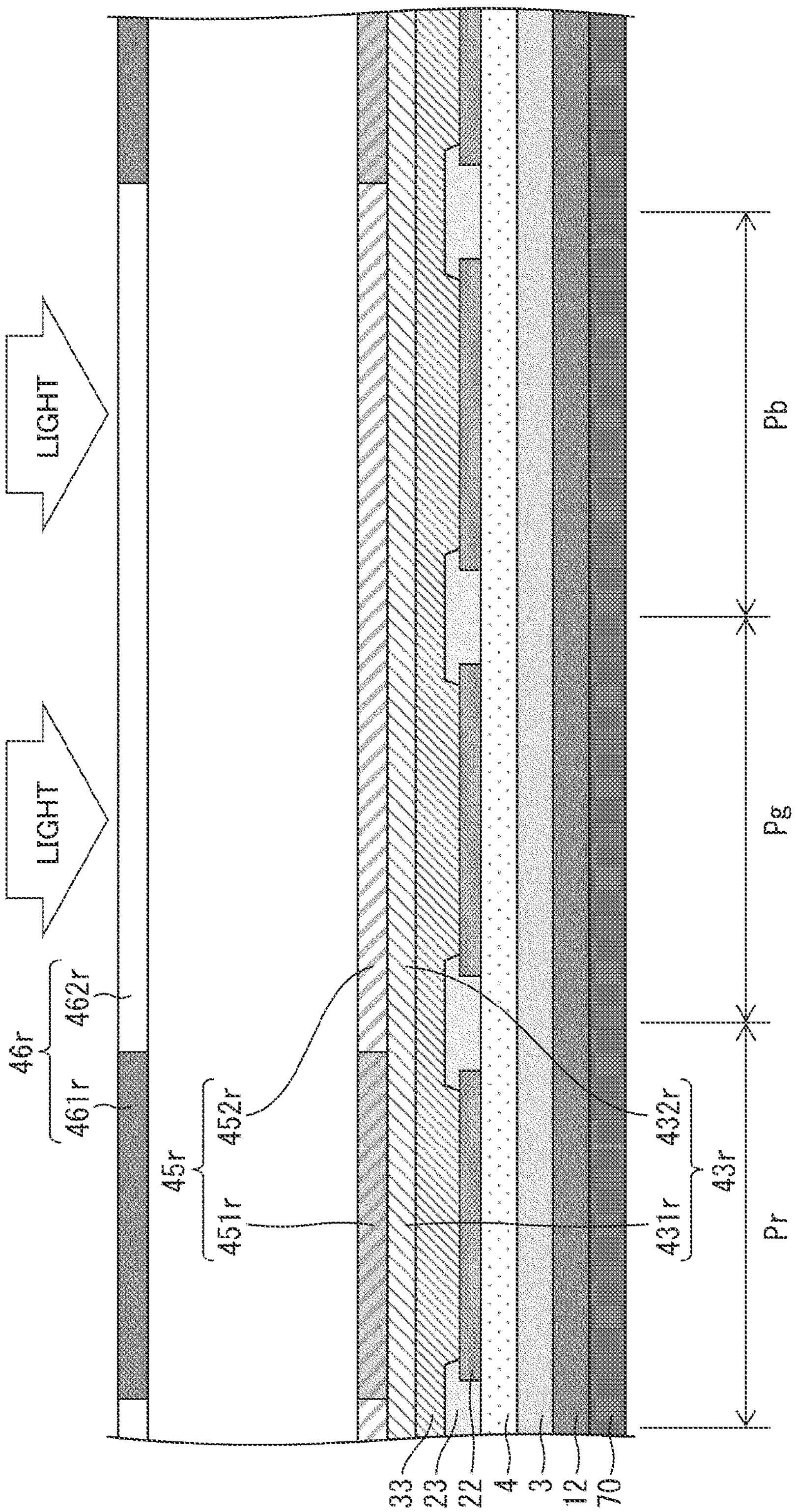
FIG. 8 is a schematic cross-sectional view of an exemplary step of forming a light-emitting element layer 5 according to an embodiment of the disclosure.

Next, as illustrated in FIGS. 6 and 8, the anode 22 is formed in the shape of an island for each of the regions of the respective subpixels P (Step S21). The edge cover 23 is formed to cover the edge of the anode 22 (Step S22). The hole transport layer 33 is formed entirely (Step S23). In this Description, the term "entirely" means that a target layer is formed not by patterning. Alternatively, the target layer is formed in common over the plurality of subpixels P.

Forming Red Light-Emitting Layer

Next, as illustrated in FIGS. 6 and 8 to 11, the red light-emitting layer 35*r* is formed (Step S24). At Step S24, the processing P1 in FIG. 7 is carried out.

That is, first, as illustrated in FIGS. 7 and 8, a solution containing the red QDs 40*r* and the second red ligands 42*r* is entirely applied to, or sprayed on, the hole transport layer 33. From the solution, the solvent is volatilized. Thus, the red QD layer 43*r* is formed entirely on the hole transport layer 33 (Step S31, a first quantum dot layer forming step). The solution to be applied or sprayed at this Step S31 does not contain the first red ligands 41*r*.

Hence, the red QD layer 43*r* is soluble either in a nonpolar solvent or in a polar solvent. Specifically, if the second red ligands 42*r* are nonpolar ligands, the red QD layer 43*r* is soluble in a nonpolar solvent. Furthermore, if the second red ligands 42*r* are polar ligands, the red QD layer 43*r* is soluble in a polar solvent.

In this Description, a material of each layer may be applied by any given technique such as inkjet printing, spin-coating, and bar-coating unless otherwise specified. Moreover, the material of each layer may be sprayed by any given technique such as electrostatic atomization and ultrasonic atomization unless otherwise specified.

Next, a photo-resist (PR) material containing a negative photoresist is applied to the red QD layer 43*r* to entirely form a negative PR layer 45*r* (a first photoresist layer) (Step S33, a photoresist layer forming step in a first quantum dot layer coating step). The negative PR in this Description is soluble in a developing solution in an initial state. When irradiated with light (in particular, ultraviolet light), the negative PR cures and becomes insoluble in the developing solution. That is, the negative PR is a curable PR (a curable photoresist) Hereinafter, each of the negative PR layer 45*r* to be applied to the red QD layer 43*r*, a negative PR layer 45*g* to be applied to the green QD layer 43*g* to be described later, and a negative PR layer 45*b* to be applied to the blue QD layer 43*b* to be described later is collectively referred to as a "negative PR layer 45".

The negative PR in the initial state is soluble in moderately polar solvents such as ketones and esters. Specifically, ketones include acetone and methyl ethyl ketone, and esters include 2-methoxy-1-methyl acetate (PGMEA), ethyl acetate, and butyl acetate. Such a moderately polar solvent is used as a solvent for application of the negative PR. As the developing solution for the negative PR, a moderately polar solvent is used as well as the solvent.

Next, using a negative red mask 46*r*, the negative PR layer 45*r* is exposed to an ultraviolet ray (Step S34, a part of a photoresist layer patterning step in the first quantum dot layer coating step). The negative red mask 46*r* includes: a first portion 461*r* blocking light and corresponding to a region for forming the red light-emitting layer 35*r*; and a second portion 462*r* not corresponding to the red light-emitting layer 35*r*, and provided with an optical opening so that the second portion 462*r* is transparent to light. Hence, a first portion 451*r*, corresponding to the red light-emitting layer 35*r* of the negative PR layer 45*r*, is not exposed to light, and remains soluble in the developing solution. Whereas, a second portion 452*r*, not corresponding to the red light-emitting layer 35*r* of the negative PR layer 45*r*, is exposed to light to cure, and becomes insoluble in the developing solution.

At Step S34, the first portion 451*r* of the negative PR layer 45*r* is not exposed to light. Such a feature can reduce damage, to a first portion 431*r* of the red QD layer 43*r*, caused by the ultraviolet irradiation.

Figure 9:
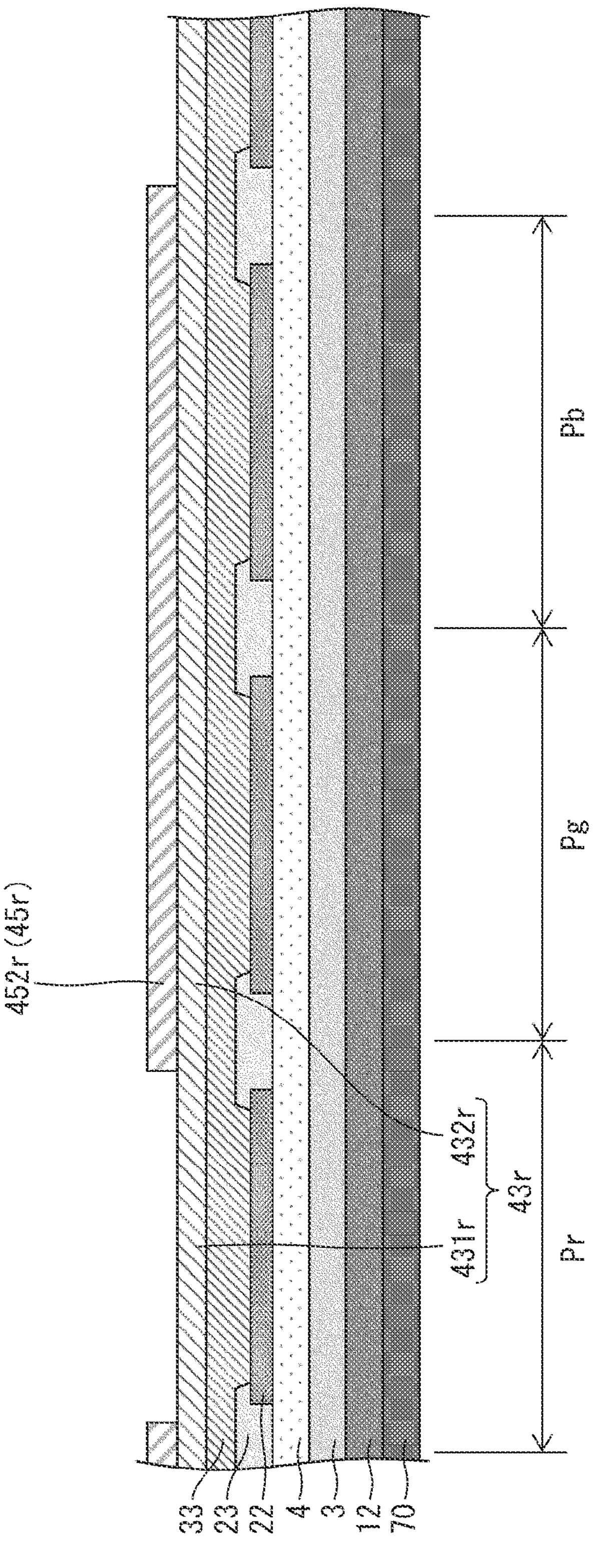
FIG. 9 is a schematic cross-sectional view of an exemplary step of forming the light-emitting element layer 5 according to the embodiment of the disclosure.

Next, as illustrated in FIGS. 7 and 9, the negative PR layer 45*r* is developed using a developing solution (Step S35, a part of the photoresist layer patterning step in the first quantum dot layer coating step). Hence, the first portion 451*r* of the negative PR layer 45*r* is soluble in the developing solution, and thus is removed. Meanwhile, the second portion 452*r* of the negative PR layer 45*r* is insoluble in the developing solution, and thus remains. As a result of this patterning, the first portion 431*r* of the red QD layer 43*r* (the first portion of the first quantum dot layer) is exposed from the negative PR layer 45*r*, and a second portion 432*r* of the red QD layer 43*r* (the first portion of the second quantum dot layer) is covered with the negative PR layer 45*r*. Such a feature makes it possible to supply the solution only to the first portion 431*r* of the red QD layer 43*r* in a downstream step.

At Step S35, preferably, the second red ligands 42*r* contained in the red QD layer 43*r*, and the developing solution for the negative PR layer 45*r*, are selected so that the red QD layer 43*r* is not removed. That is, because the developing solution for the negative PR layer 45*r* is a moderately polar solvent, either nonpolar ligands or polar ligands can be used as the second red ligands 42*r*.

In this way, the negative PR layer 45*r* is patterned, using photolithography.

Figure 10:
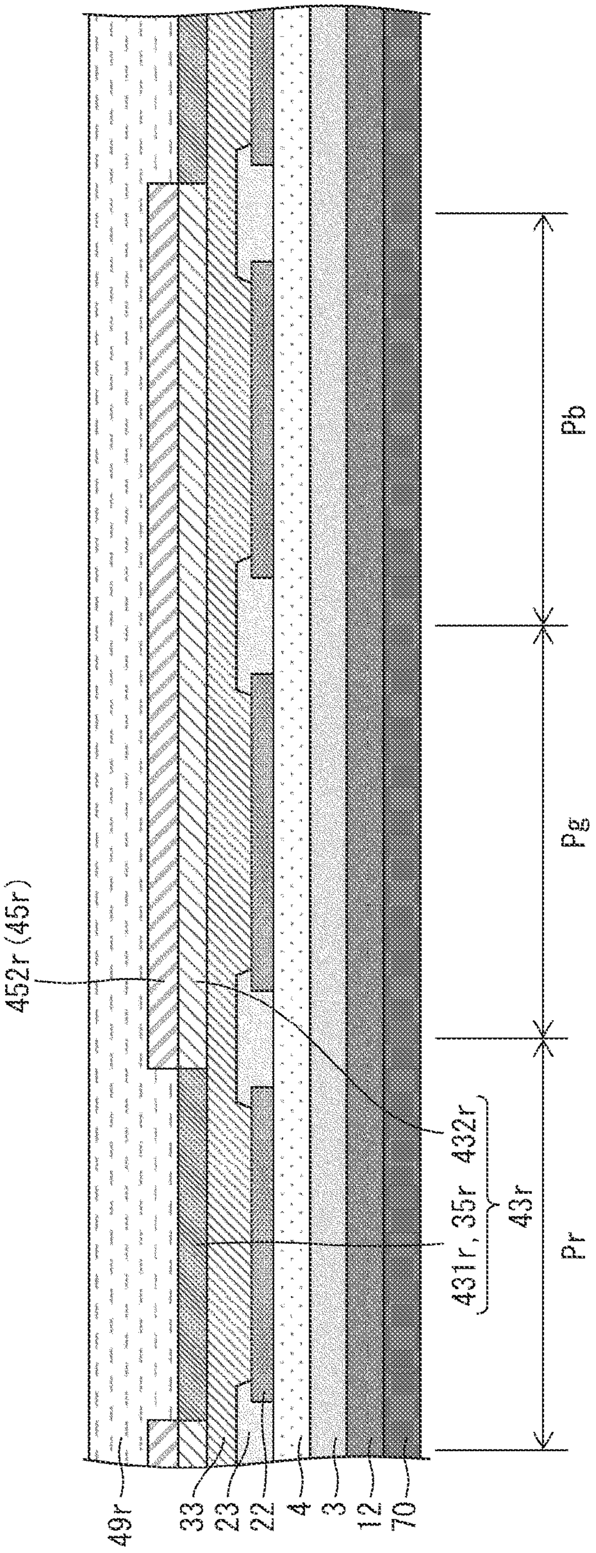
FIG. 10 is a schematic cross-sectional view of an exemplary step of forming the light-emitting element layer 5 according to the embodiment of the disclosure.

Next, as illustrated in FIGS. 7 and 10, a solution 49*r* containing the first red ligands 41*r* is entirely applied to, or sprayed on, the red QD layer 43*r* and the negative PR layer 45*r*. Hence, the solution 49*r* is supplied only to the first portion 431*r* of the red QD layer 43*r* (Step S37, a solution supplying step). A solvent contained in the solution 49*r* is preferably a volatile polar solvent such as acetonitrile, methanol, ethanol or acetone.

At Step S37, the solution 49*r* comes into contact with, and permeates through, the first portion 431*r* of the red QD layer 43*r*. Along with the permeation, the first red ligands 41*r* contained in the solution 49*r* are partially or entirely coordinated, using coordinating functional groups, with the red QDs 40*r* contained in the first portion 431*r* of the red QD layer 43*r*. Simultaneously, the second red ligands 42*r* contained in the first portion 431*r* of the red QD layer 43*r* are partially freed and dispersed in the solution 49*r*. The ligand exchange proceeds in this manner. Because each of the first red ligands 41*r* has two or more coordinating functional groups as described above, the red QDs 40*r* bond together through the first red ligands 41*r*.

Because of this bonding, the first portion 431*r* of the red QD layer 43*r* in the configuration illustrated in FIG. 5 cures to have the configuration illustrated in FIG. 4. That is, the first portion 431*r* of the red QD layer 43*r* becomes the red light-emitting layer 35*r*. The red light-emitting layer 35*r* is insoluble in the solvent regardless of whether the solvent is either a nonpolar solvent or a polar solvent.

On the other hand, at Step S37, the second portion 432*r* of the red QD layer 43*r* is isolated from the solution 49*r* by the cured second portion 452*r* of the negative PR layer 45*r*. Hence, the ligand exchange does not occur in the second portion 432*r* of the red QD layer 43*r*, and the second portion 432*r* does not become insoluble.

Hence, a cross-sectional shape of a red light-emitting layer 35*r* is not affected by the surface tension. As a result, the red light-emitting layer 35*r* is formed to have a substantially uniform thickness, that is, the difference in thickness is reduced between the center portion and the end portion of the red light-emitting layer 35*r*.

Figure 11:
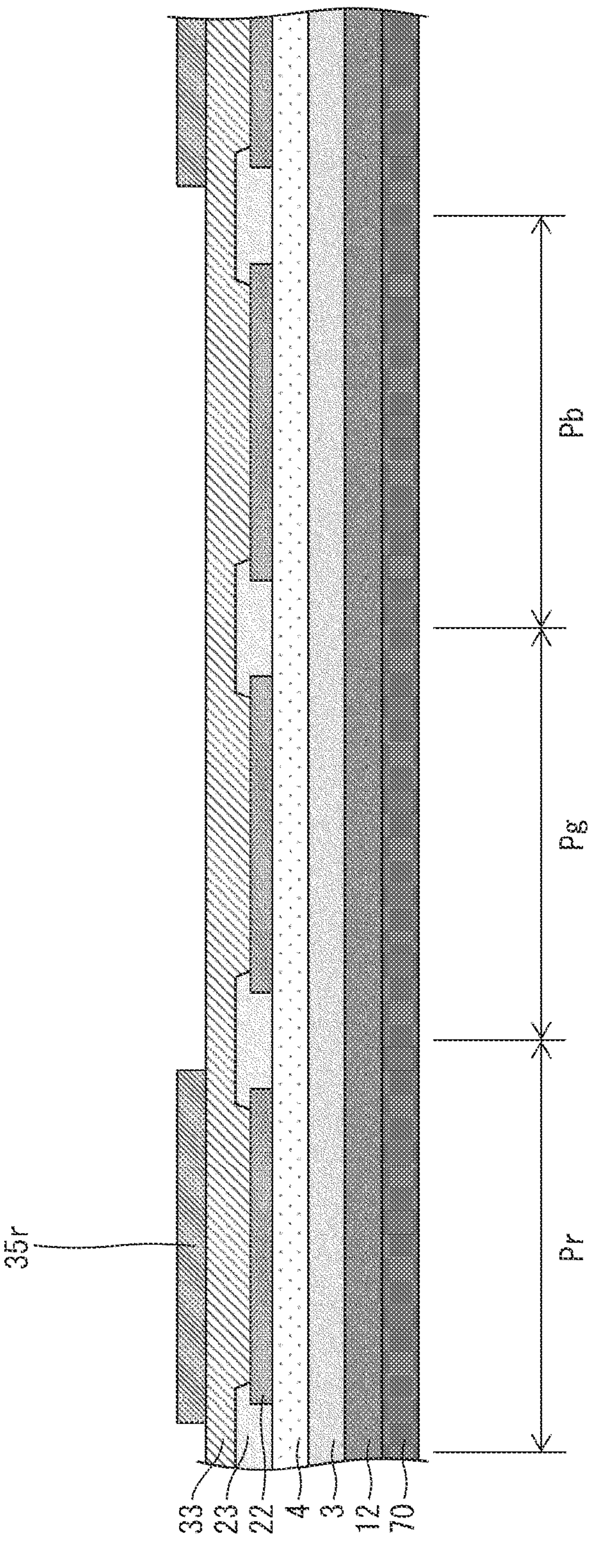
FIG. 11 is a schematic cross-sectional view of an exemplary step of forming the light-emitting element layer 5 according to the embodiment of the disclosure.

Next, as illustrated in FIGS. 7 and 11, the substrate is spun so that the solution 49*r* is removed (Step S38).

Next, the second portion 432*r* (a soluble portion) of the red QD layer 43*r* is dissolved such that the cured second portion 452*r* (the patterned photoresist layer) of the negative PR layer 45*r* is delaminated and removed. (Step S39, a removing step). Here, the second portion 432*r* of the red QD layer 43*r* is also removed. That is, at Step S39, the red light-emitting layer 35*r* is rinsed. When the second portion 432*r* of the red QD layer 43*r* is removed, the red light can be kept from mixing into a green subpixel Pb and a blue subpixel Pb other than the red subpixel Pr. Furthermore, the green light-emitting layer 35*g* and the blue light-emitting layer 35*b* can be arranged in the second direction with respect to the red light-emitting layer 35*r*.

One known technique to pattern a QD layer involves: forming a PR layer on the QD layer; patterning the PR layer using photolithography; etching the QD layer using the cured PR layer as a mask; and decomposing and removing the cured PR layer. The cured PR layer is more difficult to decompose than the uncured PR. For the decomposition of the cured PR layer, the PR layer has to be treated with a strong acid or ashed off. Thus, when the cured PR layer is decomposed and removed, the patterned QD layer below the PR layer might be damaged, or the patterned QD layer (particularly, the ligands) might be partially removed. On the other hand, at Step S39, the second portion 432*r* of the red QD layer 43*r* is dissolved so that the second portion 432*r* of the cured negative PR layer 45*r* is delaminated and removed. Furthermore, the red light-emitting layer 35*r* is cured by boding through the first ligands 41. Hence, at Step S39, when the cured second portion 452*r* of the negative PR layer 45*r* is removed, damage to the red light-emitting layer 35*r* is little. Hence, the red light-emitting layer 35*r* is not partially removed.

If the second red ligands 42*r* contained in the red QD layer 43*r* are nonpolar ligands, nonpolar solvents to be used at Step S39 can include toluene, xylene, chlorobenzene, octane, hexane, and butadiene. If the second red ligands 42*r* contained in the red QD layer 43*r* are polar ligands, polar solvents to be used at Step S39 can include acetonitrile, methanol, ethanol, dimethyl sulfoxide, N,N-dimethylformamide, and tetrahydrofuran. The insolubilized first portion 431*r* is not dissolved in any of the solvents. Hence, only the red light-emitting layer 35*r* remains.

As described above, the red QD layer 43*r* is formed entirely. The first portion 431*r* corresponding to a region, in the red QD layer 43*r*, for forming the red light-emitting layer 35*r* is made insoluble. The second portion 432*r* included in the red QD layer 43*r* and not corresponding to a region, in the red QD layer 43*r*, for forming the red light-emitting layer 35*r* is removed. This is how the red light-emitting layer 35*r* is formed. Hence, the shape of the red light-emitting layer 35*f* is not affected by the surface tension. Thus, the red light-emitting layer 35*r* can be formed to have a substantially uniform thickness, that is, the difference in thickness is reduced between the center portion and the end portion of the red light-emitting layer 35*r*. Specifically, the average thickness of the end portion of the red light-emitting layer 35*r* can be set to 80% or more and 120% or less of the average thickness of the center portion of the red light-emitting layer 35*r*.

In this Description, the "end portion" of the light-emitting layer 35 is a portion within 100 nm from an edge of the light-emitting layer 35 in one cross-section of the subpixel P, and the "center portion" of the light-emitting layer 35 is a center, and the vicinity of the center, from opposing ends of the light-emitting layer 35 in the same cross section. Here, as to a technique to measure an average thickness of the end portion of the light-emitting layer 35, two or more measurement points are selected from the end portion. Thicknesses of the respective measurement points are measured with a cross-sectional TEM. The measurement results are arithmetically averaged. This arithmetically average value is the average thickness of the end portion. As to a technique to measure an average thickness of the center portion of the light-emitting layer 35, two or more thicknesses of the center portion are measured with a cross-sectional TEM. The measurement results are arithmetically averaged. This arithmetically average value is the average thickness of the center portion.

As one known technique to pattern a QD layer, the QD layer includes QDs and a photoresist (PR) mixed together. The PR is patterned using photolithography so that the QD layer is patterned. The PR is typically an insulator. Furthermore, both a photopolymerization initiator contained in the negative PR and a component contained in the positive PR and decomposed by photoreaction are chemically unstable. Hence, with the known technique, an EL element exhibits low power efficiency and reliability. On the other hand, according to the processing P1, the red QD layer 43*r* and the red light-emitting layer 35*r* do not contain a photoresist (PR). Thanks to such a feature, the EL element can improve its power efficiency and reliability.

One known technique to pattern a QD layer involves evaporating the QDs using a mask. The highest definition of coating by this mask evaporation is approximately 800 ppi. Furthermore, one known technique to pattern a QD layer involves ink-jet printing of a solution containing QDs. The highest definition of coating by this ink-jet printing is approximately 300 ppi. On the other hand, the highest definition of coating by photolithography is approximately 3000 ppi. Hence, with the processing P1, the red light-emitting layer 35*r* can be coated with high definition, and the resulting definition of the display device 2 can be improved.

Forming Green Light-Emitting Layer

Next, as illustrated in FIGS. 6 and 12 to 15, the green light-emitting layer 35*g* is formed (Step S25, a second quantum dot forming step). At Step S25, as seen at Step S24, the processing P1 illustrated in FIG. 7 is carried out.

Figure 12:
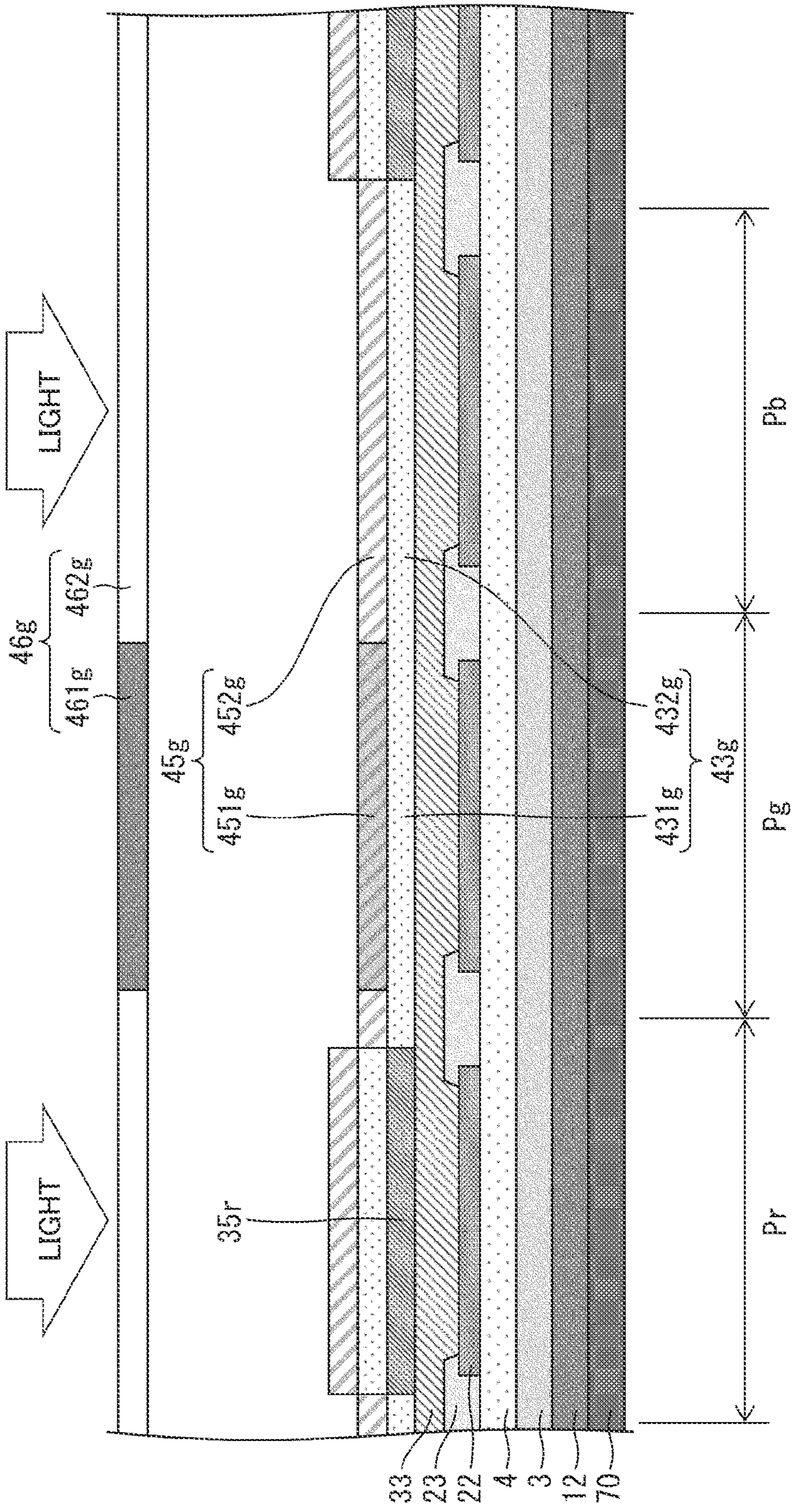
FIG. 12 is a schematic cross-sectional view of an exemplary step of forming the light-emitting element layer 5 according to the embodiment of the disclosure.

That is, first, as illustrated in FIGS. 7 and 12, a solution containing the green QDs 40*g* and the second green ligands 42*g* is entirely applied to, or sprayed on, the red light-emitting layer 35*r* and the hole transport layer 33. The solvent is volatilized from the solution. Thus, the green QD layer 43*g* is formed over the entire surface of the substrate; that is, the green QD layer 43*g* is formed entirely to cover the red light-emitting layer 35*r* and the hole transport layer 33 (Step S31). The solution to be applied or sprayed at this Step S31 does not contain the first green ligands 41*g*. Hence, the green QD layer 43*g* is soluble either in a nonpolar solvent or in a polar solvent.

Thus, as being formed entirely, the green light-emitting layer 35*g* can be formed between the red light-emitting layers 35*r*. That is, the green light-emitting layer 35*g* can be disposed in the second direction with respect to the red light-emitting layers 35*r*.

Next, a PR material containing a negative PR is applied to the green QD layer 43*g* to entirely form a negative PR layer 45*g* (Step S33).

Next, using a negative green mask 46*g*, the negative PR layer 45*g* is exposed to an ultraviolet ray (Step S34). The negative green mask 46*g* includes: a first portion 461*g* blocking light and corresponding to a region for forming the green light-emitting layer 35*g*; and a second portion 462*g* not corresponding to the green light-emitting layer 35*g*, and provided with an optical opening so that the second portion 462*g* is transparent to light. Hence, a first portion 451*g*, corresponding to the green light-emitting layer 35*g* of the negative PR layer 45*g*, is not exposed to light, and remains soluble in the developing solution. Whereas, a second portion 452*g*, not corresponding to the green light-emitting layer 35*g* of the negative PR layer 45*g*, is exposed to light to cure, and becomes insoluble in the developing solution.

Figure 13:
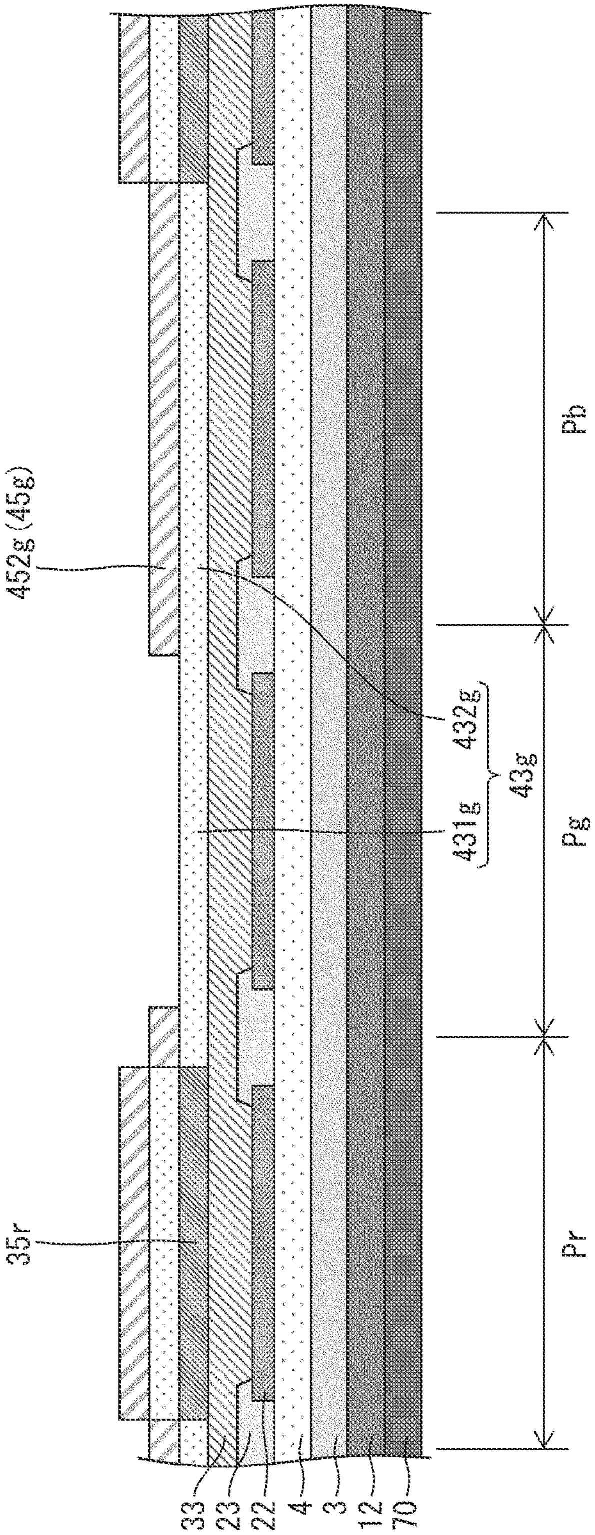
FIG. 13 is a schematic cross-sectional view of an exemplary step of forming the light-emitting element layer 5 according to the embodiment of the disclosure.

Next, as illustrated in FIGS. 7 and 13, the negative PR layer 45*g* is developed using a developing solution (Step S35). As a result of this patterning, a first portion 431*g* of the green QD layer 43*g* is exposed from the negative PR layer 45*g*, and a second portion 432*g* of the green QD layer 43*g* is covered with the negative PR layer 45*g*.

At Step S35, preferably, the second green ligands 42*g* contained in the green QD layer 43*g*, and the developing solution for the negative PR layer 45*g*, are selected so that the green QD layer 43*g* is not removed.

Hence, using photolithography, the negative PR layer 45*g* is patterned.

Figure 14:
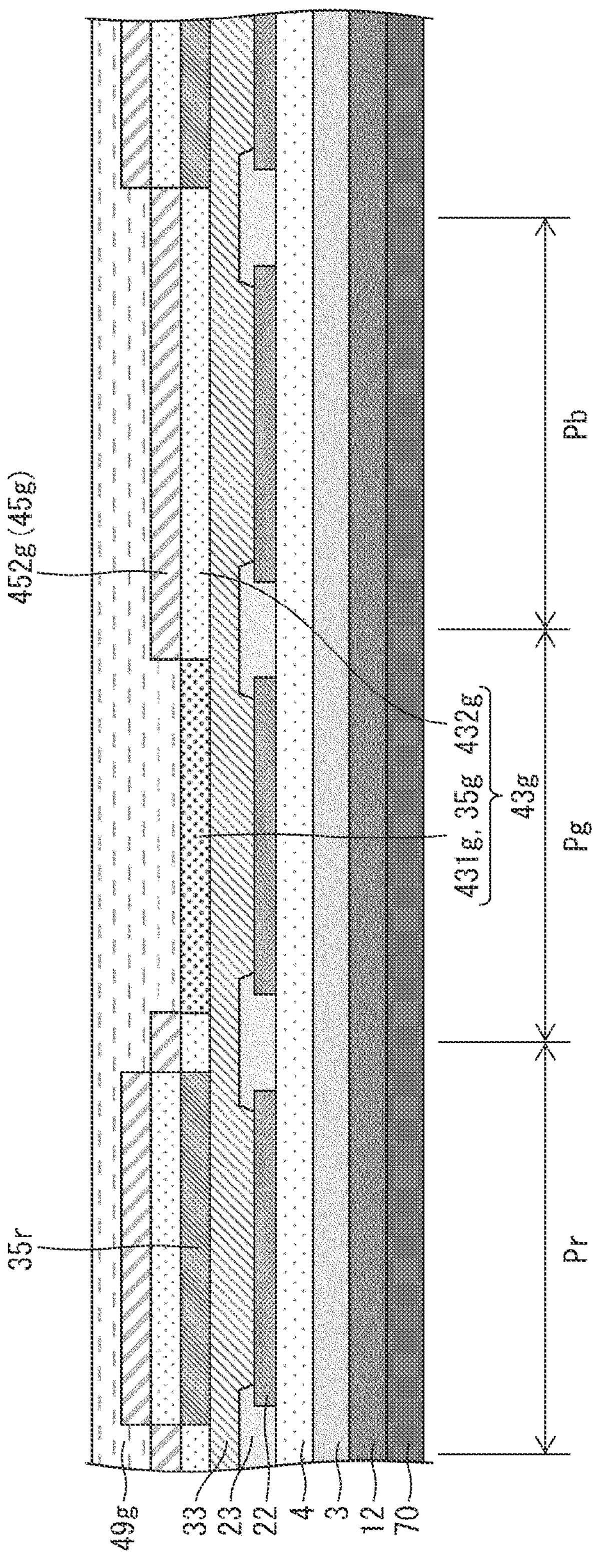
FIG. 14 is a schematic cross-sectional view of an exemplary step of forming the light-emitting element layer 5 according to the embodiment of the disclosure.

Next, as illustrated in FIGS. 7 and 14, a solution 49*g* containing the first green ligands 41*g* is entirely applied to, or sprayed on, the green QD layer 43*g* and the negative PR layer 45*g*. Hence, the solution 49*g* is supplied only to the first portion 431*g* of the green QD layer 43*g* (Step S37). A solvent contained in the solution 49*g* is preferably a volatile polar solvent such as acetonitrile, methanol, ethanol or acetone.

At Step S37, the solution 49*g* comes into contact with, and permeates through, the first portion 431*g* of the green QD layer 43*g*. Along with the permeation, the first green ligands 41*g* contained in the solution 49*g* are partially or entirely coordinated, using coordinating functional groups, with the green QDs 40*g* contained in the first portion 431*g* of the green QD layer 43*g*. Simultaneously, the second green ligands 42*g* contained in the first portion 431*g* of the green QD layer 43*g* are partially freed and dispersed in the solution 49*g*. The ligand exchange proceeds in this manner. Because each of the first green ligands 41*g* has two or more coordinating functional groups as described above, the green QDs 40*g* bond together through the first green ligands 41*g*.

Because of this bonding, the first portion 431*g* of the green QD layer 43*g* in the configuration illustrated in FIG. 5 cures to have the configuration illustrated in FIG. 4. That is, the first portion 431*g* of the green QD layer 43*g* becomes the green light-emitting layer 35*g*. The green light-emitting layer 35*g* is insoluble in a solvent regardless of whether the solvent is either a nonpolar solvent or a polar solvent.

On the other hand, at Step S37, the second portion 432*g* of the green QD layer 43*g* is isolated from the solution 49*g* by the cured second portion 452*g* of the negative PR layer 45*g*. Hence, the ligand exchange does not occur in the second portion 432*g* of the green QD layer 43*g*, and the second portion 432*g* does not become insoluble.

Figure 15:
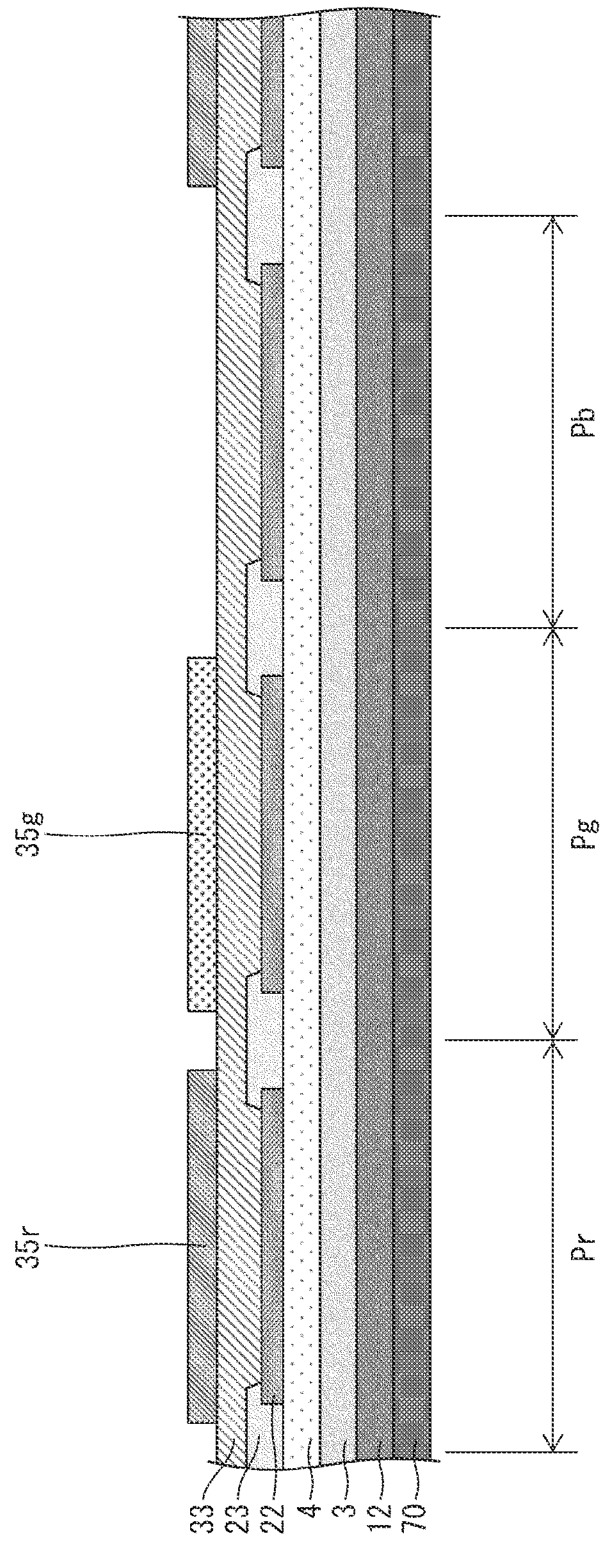
FIG. 15 is a schematic cross-sectional view of an exemplary step of forming the light-emitting element layer 5 according to the embodiment of the disclosure.

Next, as illustrated in FIGS. 7 and 15, the solution 49*g* is removed (Step S38).

Next, the second portion 432*g* (a soluble portion) of the green QD layer 43*g* is dissolved such that the cured second portion 452*g* of the negative PR layer 45*g* is delaminated and removed. (Step S39). Here, the second portion 432*g* of the green QD layer 43*g* is also removed. That is, at Step S39, the green light-emitting layer 35*g* is rinsed.

As described above, in the formation of the green light-emitting layer 35*g*, the processing P1 achieves the same advantageous effects as those in forming the red light-emitting layer 35*r*.

Forming Blue Light-Emitting Layer

Next, as illustrated in FIGS. 6 and 16 to 19, the blue light-emitting layer 35*b* is formed (Step S26). At Step S26, as seen at Steps S24 and S25, the processing P1 illustrated in FIG. 7 is carried out.

Figure 16:
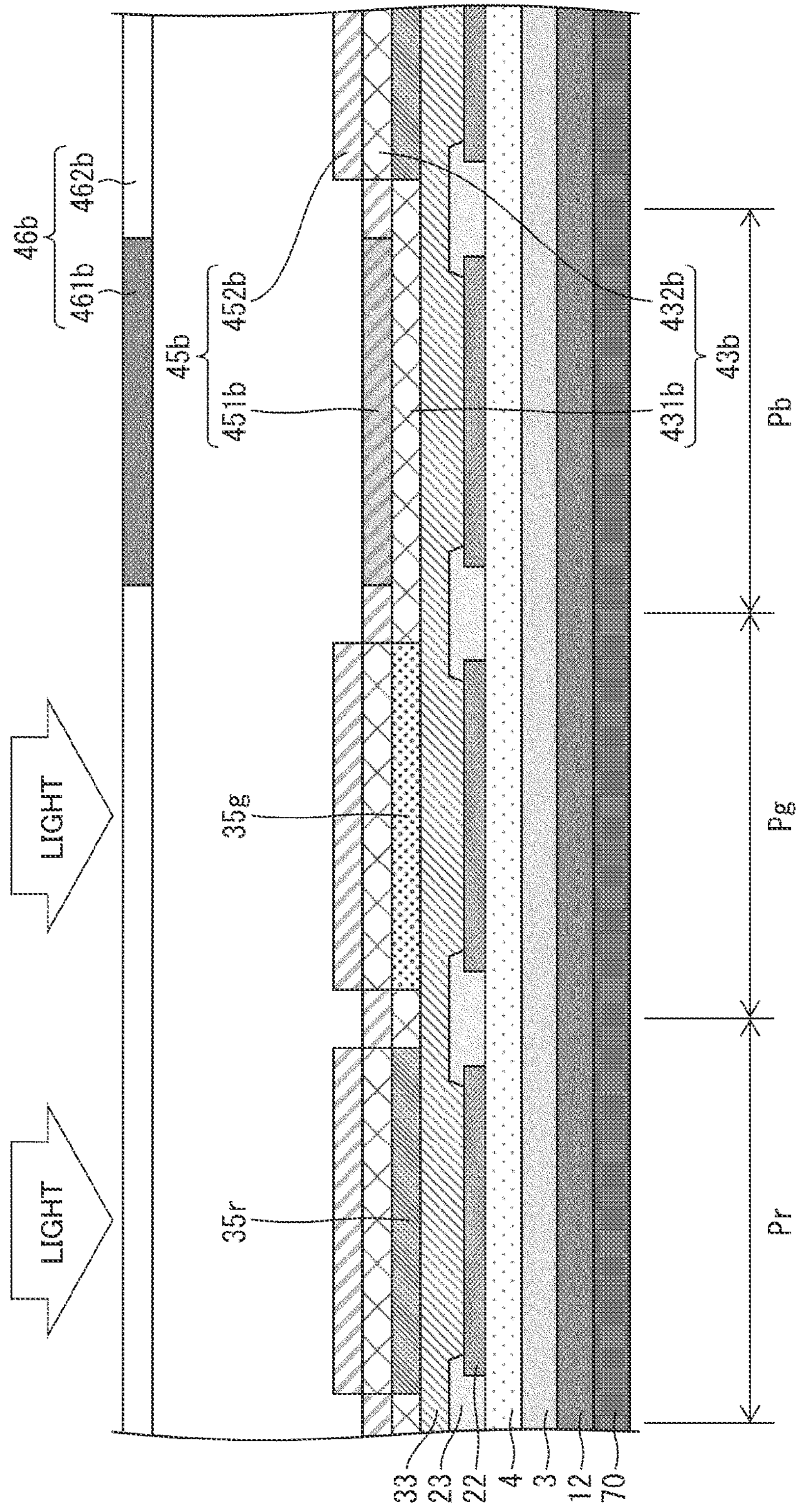
FIG. 16 is a schematic cross-sectional view of an exemplary step of forming the light-emitting element layer 5 according to the embodiment of the disclosure.

That is, first, as illustrated in FIGS. 7 and 16, a solution containing the blue QDs 40*b* and the second blue ligands 42*b* is entirely applied to, or sprayed on, the red light-emitting layer 35*r*, the green light-emitting layer 35*g*, and the hole transport layer 33. From the solution, the solvent is volatilized. Thus, the blue QD layer 43*b* is formed over the entire surface of the substrate; that is, the blue QD layer 43*b* is formed entirely to cover the red light-emitting layer 35*r*, the green light-emitting layer 35*g*, and the hole transport layer 33 (Step S31). The solution to be applied or sprayed at this Step S31 does not contain the first blue ligands 41*b*.

Next, a PR material containing a negative PR is applied to the blue QD layer 43*b* to entirely form a negative PR layer 45*b* (Step S33).

Next, using a negative green mask 46*b*, the negative PR layer 45*b* is exposed to an ultraviolet ray (Step S34). The negative blue mask 46*b* includes: a first portion 461*b* blocking light and corresponding to a region for forming the blue light-emitting layer 35*b*; and a second portion 462*b* not corresponding to the blue light-emitting layer 35*b*, and provided with an optical opening so that the second portion 462*b* is transparent to light. Hence, a first portion 451*b*, corresponding to the blue light-emitting layer 35*b* of the negative PR layer 45*b*, is not exposed to light, and remains soluble in the developing solution. Whereas, a second portion 452*b*, not corresponding to the blue light-emitting layer 35*b* of the negative PR layer 45*b*, is exposed to light to cure, and becomes insoluble in the developing solution.

Figure 17:
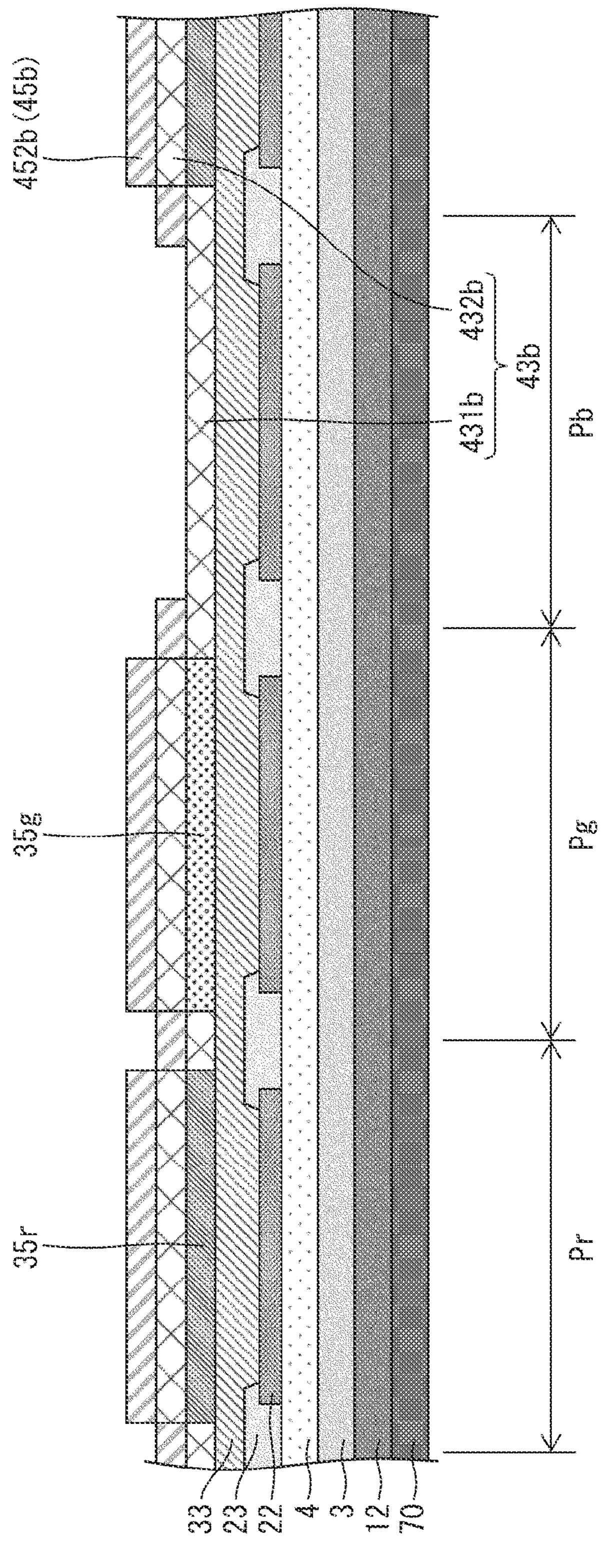
FIG. 17 is a schematic cross-sectional view of an exemplary step of forming the light-emitting element layer 5 according to the embodiment of the disclosure.

Next, as illustrated in FIGS. 7 and 17, the negative PR layer 45*b* is developed using a developing solution (Step S35). As a result of this patterning, a first portion 431*b* of the blue QD layer 43*b* is exposed from the negative PR layer 45*b*, and a second portion 432*b* of the blue QD layer 43*b* is covered with the negative PR layer 45*b*.

At Step S35, preferably, the second blue ligands 42*b* contained in the blue QD layer 43*b*, and the developing solution for the negative PR layer 45*b*, are selected so that the blue QD layer 43*b* is not removed.

Hence, using photolithography, the negative PR layer 45*b* is patterned.

Figure 18:
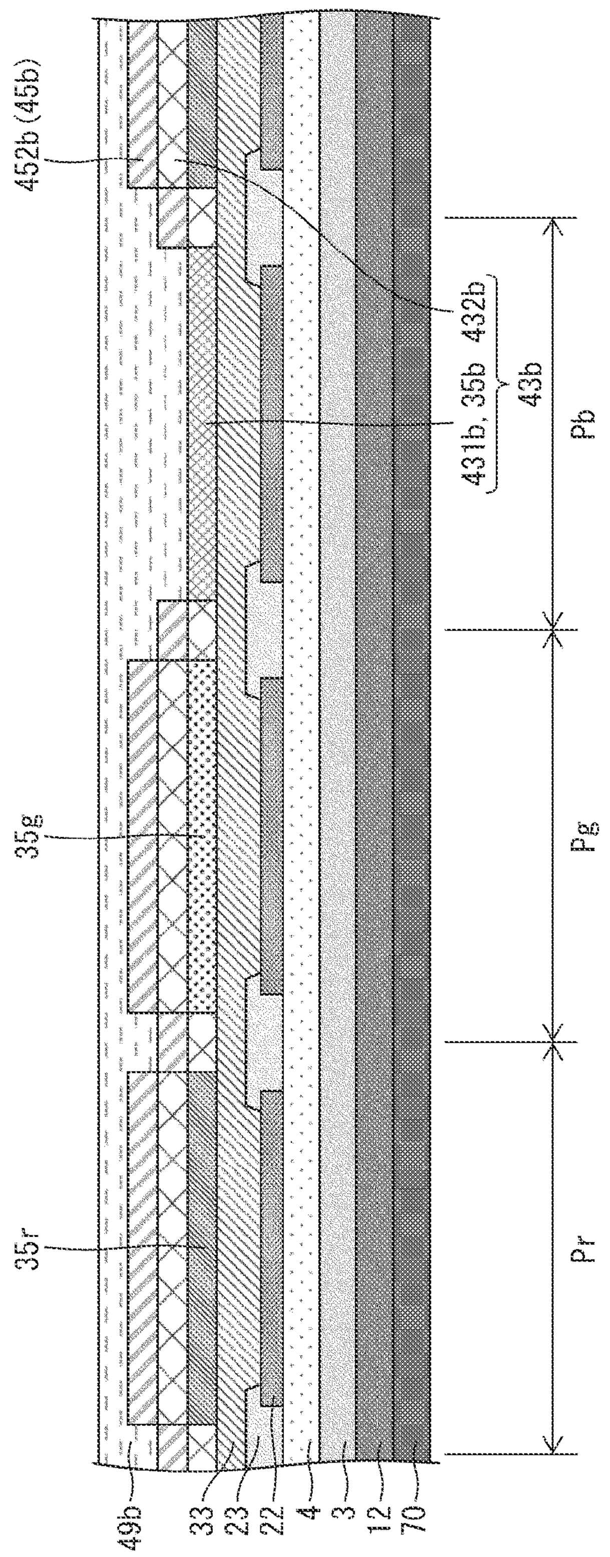
FIG. 18 is a schematic cross-sectional view of an exemplary step of forming the light-emitting element layer 5 according to the embodiment of the disclosure.

Next, as illustrated in FIGS. 7 and 18, a solution 49*b* containing the first blue ligands 41*b* is entirely applied to, or sprayed on, the blue QD layer 43*b* and the negative PR layer 45*b*. Hence, the solution 49*b* is supplied only to the first portion 431*b* of the blue QD layer 43*b* (Step S37). A solvent contained in the solution 49*b* is preferably a volatile polar solvent such as acetonitrile, methanol, ethanol or acetone.

At Step S37, the solution 49*b* comes into contact with, and permeates through, the first portion 431*b* of the blue QD layer 43*b*. Along with the permeation, the first blue ligands 41*b* contained in the solution 49*b* are partially or entirely coordinated, using coordinating functional groups, with the blue QDs 40*b* contained in the first portion 431*b* of the blue QD layer 43*b*. Simultaneously, the second blue ligands 42*b* contained in the first portion 431*b* of the blue QD layer 43*b* are partially freed and dispersed in the solution 49*b*. The ligand exchange proceeds in this manner. Because each of the first blue ligands 41*b* has two or more coordinating functional groups as described above, the blue QDs 40*b* bond together through the first blue ligands 41*b*.

Because of this bonding, the first portion 431*b* of the blue QD layer 43*b* in the configuration illustrated in FIG. 5 cures to have the configuration illustrated in FIG. 4. That is, the first portion 431*b* of the blue QD layer 43*b* becomes the blue light-emitting layer 35*b*. The blue light-emitting layer 35*b* is insoluble in a solvent regardless of whether the solvent is either a nonpolar solvent or a polar solvent.

On the other hand, at Step S37, the second portion 432*b* of the blue QD layer 43*b* is isolated from the solution 49*b* by the cured second portion 452*b* of the negative PR layer 45*b*. Hence, the ligand exchange does not occur in the second portion 432*b* of the blue QD layer 43*b*, and the second portion 432*b* does not become insoluble.

Figure 19:
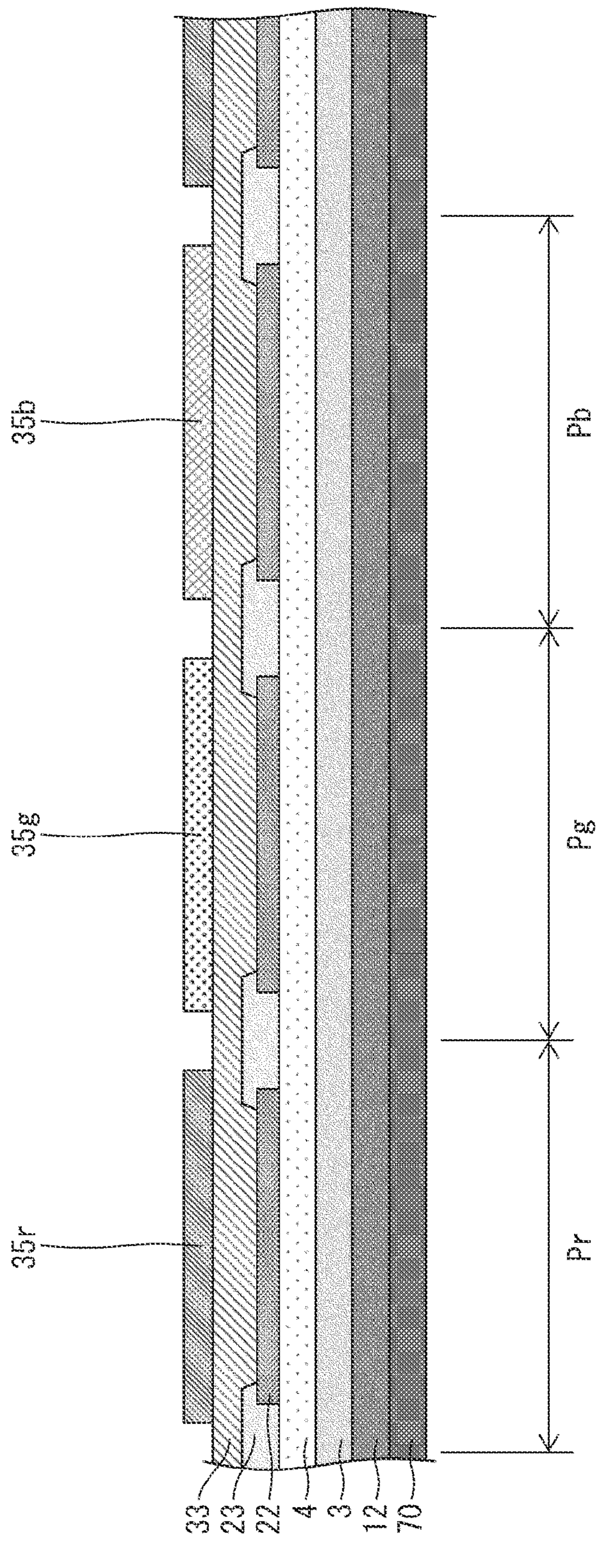
FIG. 19 is a schematic cross-sectional view of an exemplary step of forming the light-emitting element layer 5 according to the embodiment of the disclosure.

Next, as illustrated in FIGS. 7 and 19, the solution 49*b* is removed (Step S38).

Next, the second portion 432*b* (a soluble portion) of the blue QD layer 43*b* is dissolved such that the cured second portion 452*b* of the negative PR layer 45*b* is delaminated and removed. (Step S39). Here, the second portion 432*b* of the blue QD layer 43*b* is also removed. That is, at Step S39, the blue light-emitting layer 35*b* is rinsed.

As described above, in the formation of the blue light-emitting layer 35*b*, the processing P1 achieves the same advantageous effects as those in forming the red light-emitting layer 35*r*.

Next, as shown in FIG. 6, the electron transport layer 37 is entirely formed (Step S27), and the cathode 25 is entirely formed (Step S28). This is how the light-emitting element layer 5 in FIG. 3 is formed.

Modification

Scopes of the first embodiment and the second to fourth embodiments to be described later shall not be limited to the above configurations and method. For example, with respect to the active layer 24, the cathode 25 may be positioned toward the substrate (toward the lower-face film 10 or the mother glass 70), and the anode 22 may be positioned across from the substrate. For example, Steps S24, S25, and S26 can be carried out in a different order.

Second Embodiment

Another embodiment of the disclosure will be described below. Note that, for convenience in description, like reference signs designate members having identical functions throughout the first and second embodiments. These members will not be elaborated upon repeatedly.

Figure 20:
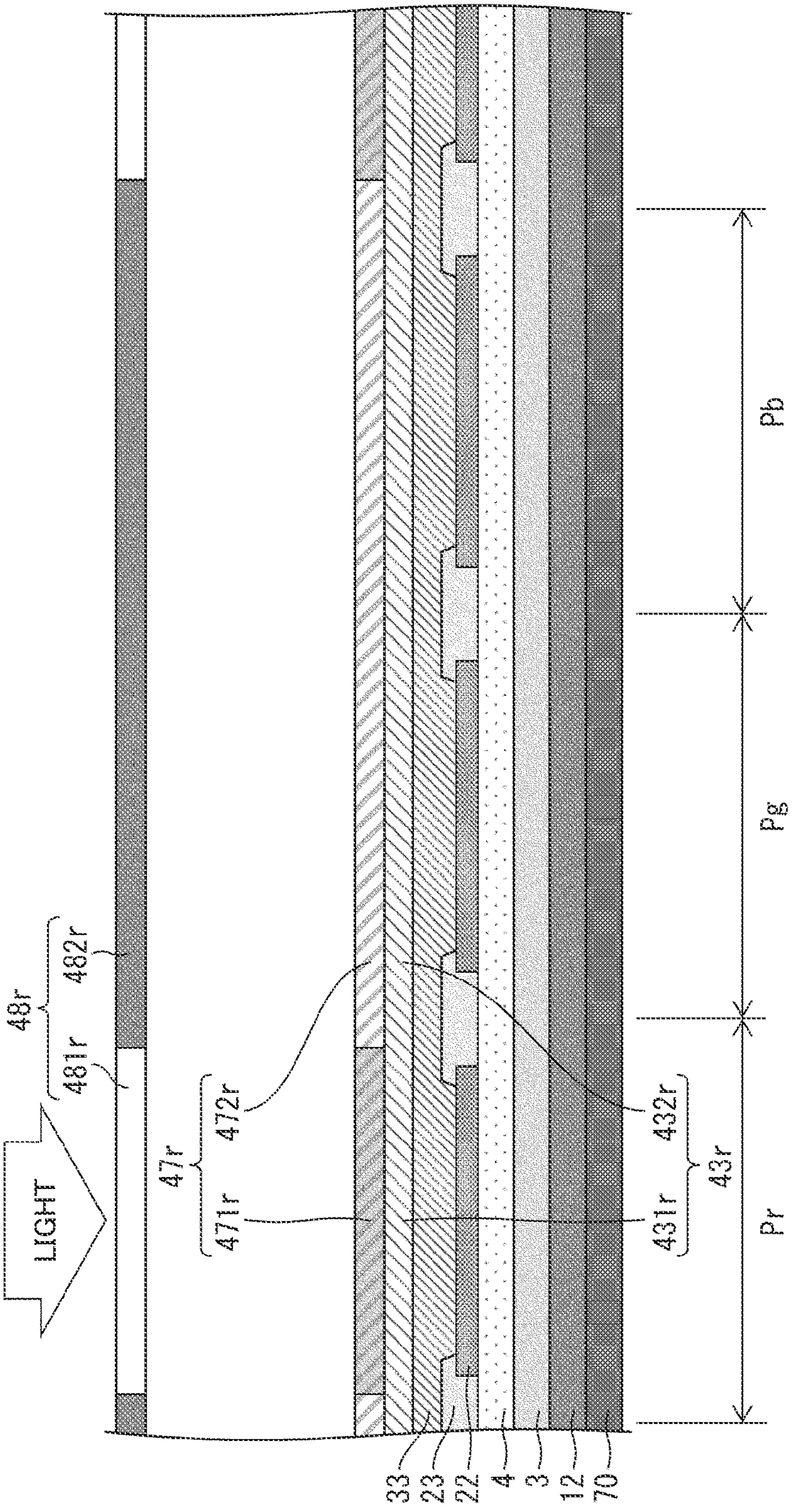
FIG. 20 is a schematic cross-sectional view of an exemplary step of forming the light-emitting element layer 5 according to another embodiment of the disclosure.
Figure 21:
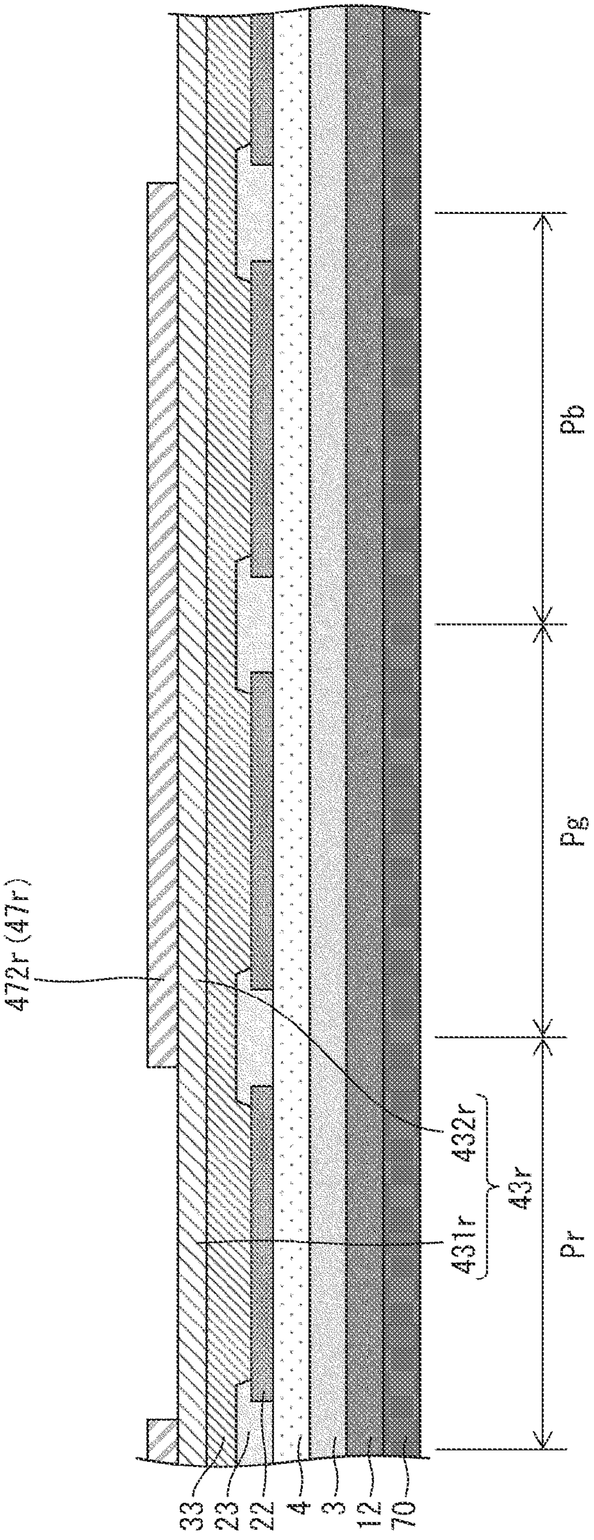
FIG. 21 is a schematic cross-sectional view of an exemplary step of forming the light-emitting element layer 5 according to the other embodiment of the disclosure.

Each of FIGS. 20 and 21 is a schematic cross-sectional view of an exemplary step of forming the light-emitting element layer 5 (Step S4) according to the second embodiment.

The method according to the second embodiment can also form the light-emitting element layer 5 illustrated in FIG. 3.

The method according to this second embodiment differs from the method according to the first embodiment in that, in the former method, a PR material containing a positive PR is used at Step S33 of FIG. 7, a positive mask is used at Step S34 of FIG. 7, and a developing solution is used for the positive PR at Step S35 of FIG. 7. The method according to the second embodiment may differ from the first embodiment described above. In the former embodiment, the positive PR layer is optionally exposed to light and removed at Step S39 of FIG. 7. Otherwise, the method according to the second embodiment is the same as the method according to the first embodiment described above. In this Description, the positive PR is insoluble in a developing solution in an initial state. When irradiated with light (in particular, ultraviolet light), the positive PR decomposes and becomes soluble in the developing solution. That is, the positive PR is a decomposable PR (a decomposable photoresist).

As a developing solution for the positive PR, a basic aqueous solution is used. Examples of the developing solution can include: an aqueous solution of alkalies such as sodium hydroxide, potassium hydroxide, tetramethylammonium hydroxide, sodium carbonate, ammonia water, ethylamine, and diethylamine; and a liquid mixture of the aqueous solutions. Furthermore, the aqueous solution of alkalies or the liquid mixture of the aqueous solutions may additionally contain an appropriate amount of: a water-soluble organic solvent such as methanol, ethanol, or acetone; and/or a surfactant. Such an aqueous solution or a liquid mixture can be used as the developing solution.

For example, described is a case where, at Step S24 of forming the red light-emitting layer 35*r*, the processing P1 illustrated in FIG. 7 is carried out.

As illustrated in FIGS. 7 and 20, following Step S32, a PR material containing a positive PR is applied to the red QD layer 43*r*, so as to entirely form a positive PR layer 47*r* (a first photoresist) (Step S33). Next, using a positive red mask 48*r*, the positive PR layer 47*r* is exposed to an ultraviolet ray (Step S34). The positive red mask 48*r* includes: a first portion 481*r* transparent to light and corresponding to a region for forming the red light-emitting layer 35*r*; and a second portion 482*r* not corresponding to the red light-emitting layer 35*r*, and provided with an optical opening so that the second portion 482*r* blocks light. Hence, a first portion 471*r* corresponding to the red light-emitting layer 35*r* of the positive PR layer 47*r* is exposed to light and becomes soluble in the developing solution; whereas, a second portion 472*r* not corresponding to the red light-emitting layer 35*r* of the positive PR layer 47*r* is not exposed to light, and remains insoluble in the developing solution.

Next, as illustrated in FIGS. 7 and 21, the positive PR layer 47*r* is developed using a developing solution for the positive PR (Step S35). Hence, the first portion 471*r* of the positive PR layer 47*r* is soluble in the developing solution, and thus is removed moved. Meanwhile, the second portion 472*r* of the positive PR layer 47*r* is insoluble in the developing solution, and thus remains. As a result of this patterning, the first portion 431*r* of the red QD layer 43*r* is exposed from the positive PR layer 47*r*, and the second portion 432*r* of the red QD layer 43*r* is covered with the positive PR layer 47*r*.

At Step S35, the second red ligands 42*r* contained in the red QD layer 43*r* are preferably nonpolar ligands so that the red QD layer 43*r* is not removed.

Subsequently, Steps S37 to S39 are carried out. The method according to the second embodiment may differ from the method according to the first embodiment. In the former embodiment, at Step S39, the second portion 472*r* of the positive PR layer 47*r* may be exposed to light and removed. When exposed to light, the second portion 472*r* of the positive PR layer 47*r* becomes soluble in the developing solution. Hence, the second portion 472*r* is easily removed. The second portion 472*r* may be exposed entirely to light without using a mask. However, in order to reduce damage to the red light-emitting layer 35*r*, the negative red mask 46*r* is preferably used so that only the second portion 472*r* of the positive PR layer 47*r* is exposed to light. When the second portion 472*r* of the positive PR layer 47*r* is exposed to light and then removed, the developing solution may be used to decompose and remove the second portion 472*r*. After that, the same solution as, or a different solution from, the developing solution may be used to remove the second portion 432*r* of the red QD layer 43*r*.

Even though detailed descriptions will be omitted, the PR material containing a positive PR, the positive mask, and the developing solution for the positive PR are also used in the case where the processing P1 shown in FIG. 7 is carried out at Step S25 of forming the green light-emitting layer 35*g* and Step S26 of forming the blue light-emitting layer 35*b*.

Third Embodiment

Another embodiment of the disclosure will be described below. Note that, for convenience in description, like reference signs designate members having identical functions throughout the first to third embodiments. These members will not be elaborated upon repeatedly.

Figure 22:
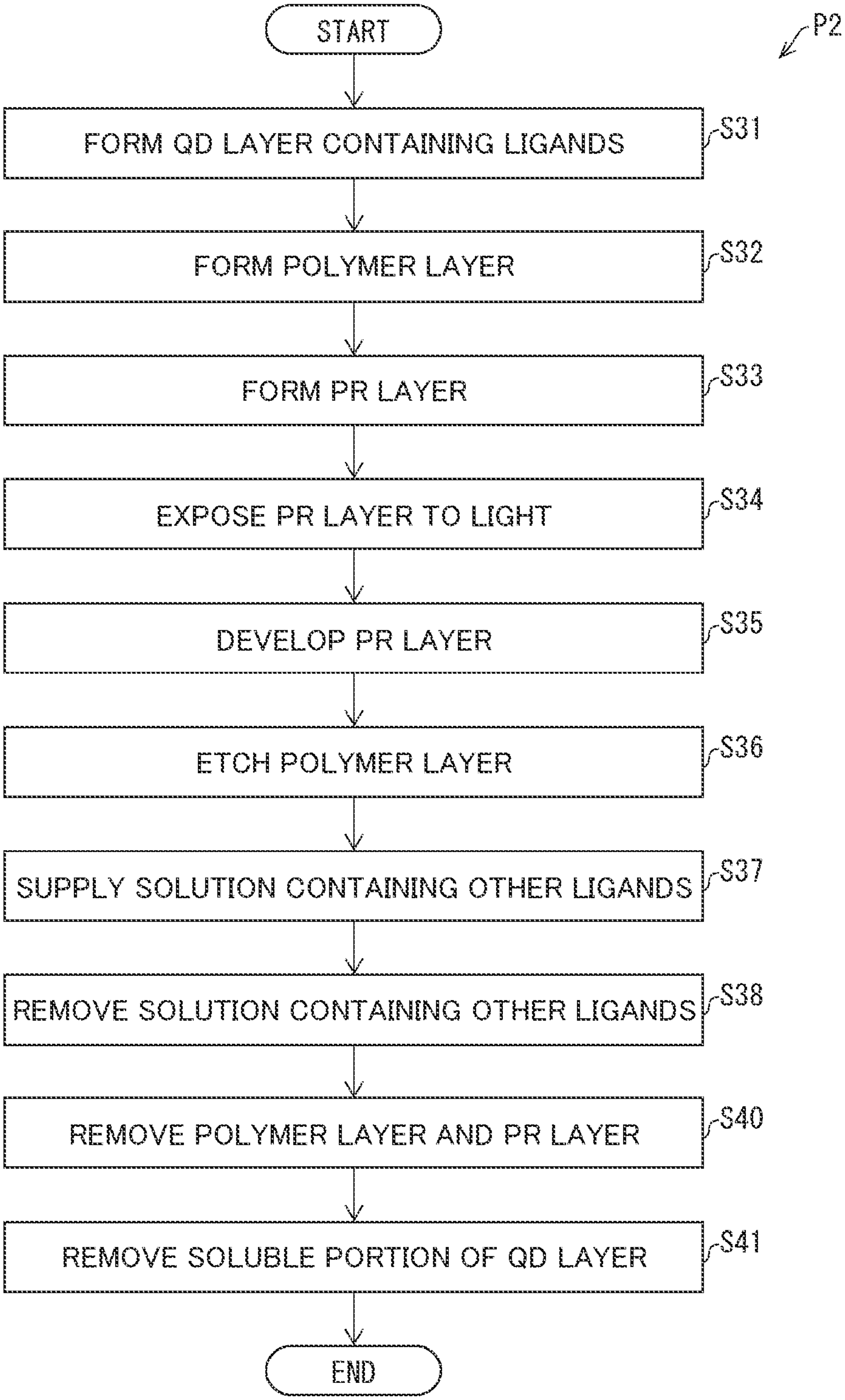
FIG. 22 is a schematic flowchart showing other processing carried out at each of the steps of forming the light-emitting layer illustrated in FIG. 6.

FIG. 22 is a schematic flowchart illustrating other processing P2 carried out at each of a step of forming the red light-emitting layer 35*r* (Step S24), a step of forming the green light-emitting layer 35*g* (Step S25), and a step of forming the blue light-emitting layer 35*b* (Step S26). These steps are shown in FIG. 6.

Figure 23:
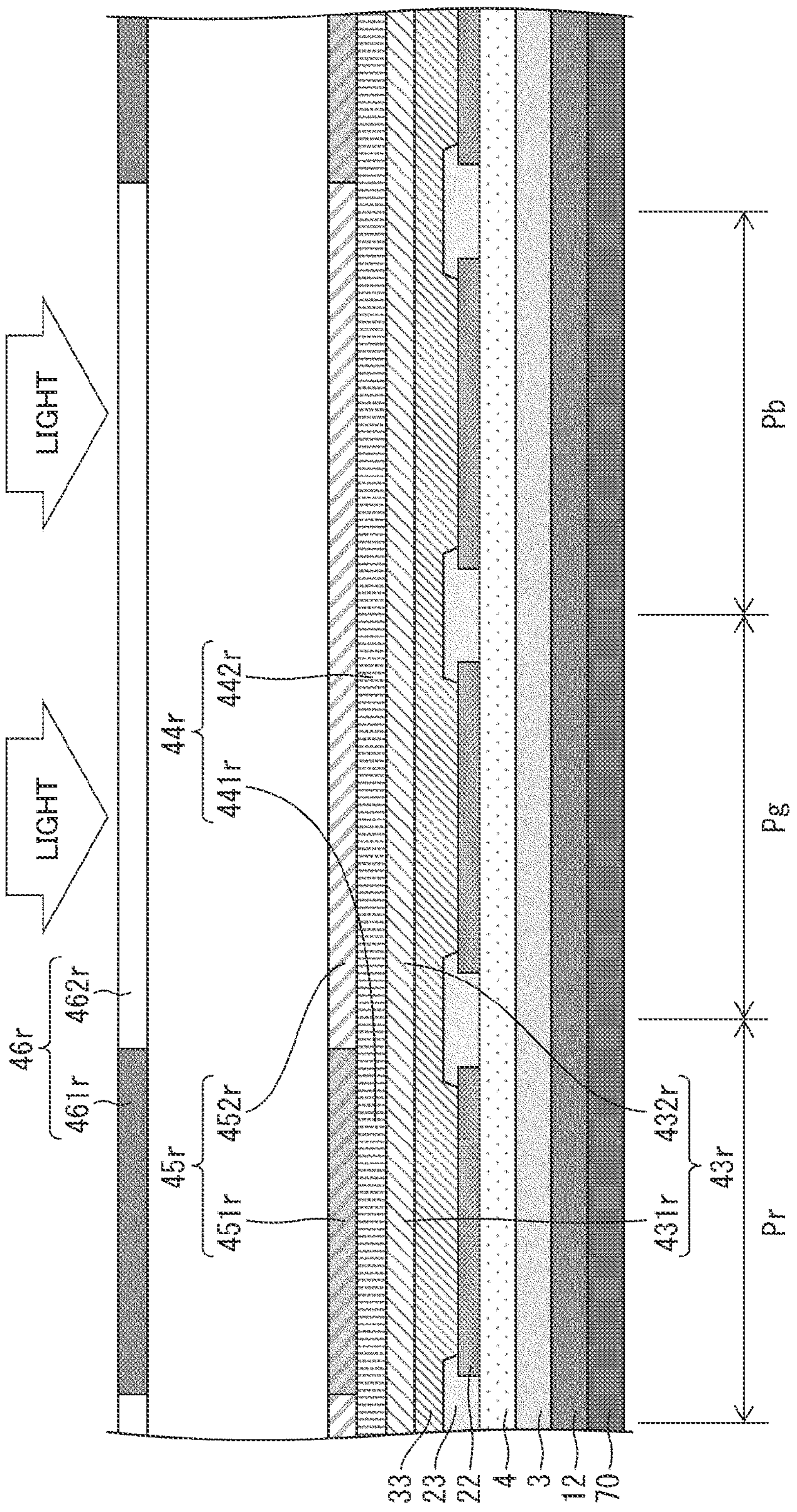
FIG. 23 is a schematic cross-sectional view of an exemplary step of forming the light-emitting element layer 5 according to still another embodiment of the disclosure.
Figure 24:
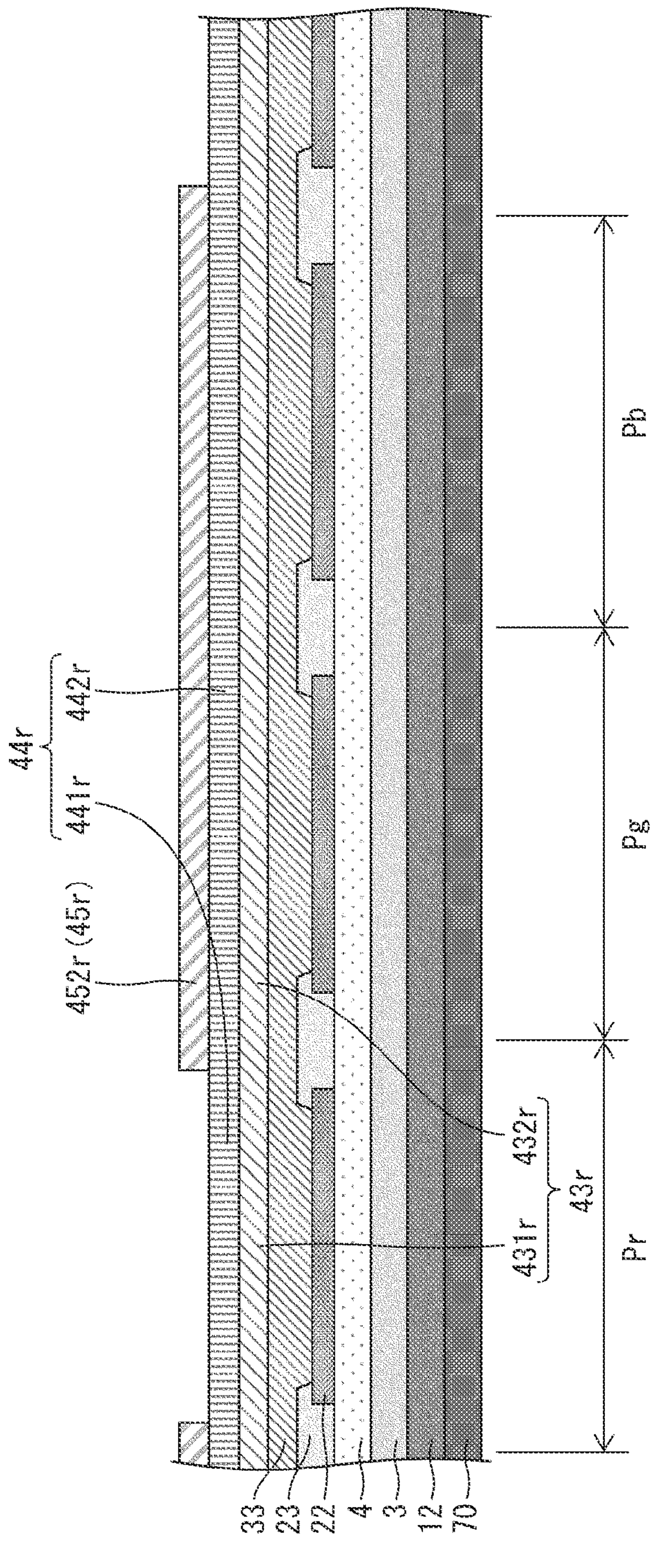
FIG. 24 is a schematic cross-sectional view of an exemplary step of forming the light-emitting element layer 5 according to the still other embodiment of the disclosure.
Figure 25:
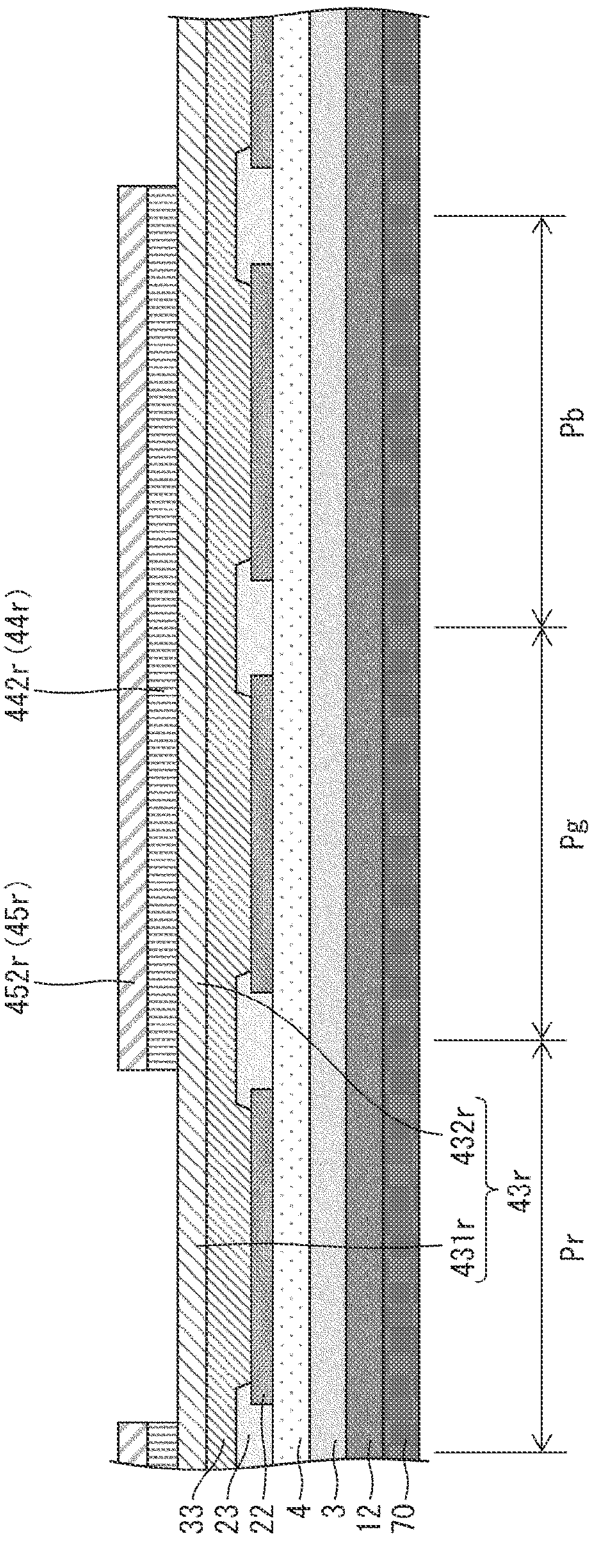
FIG. 25 is a schematic cross-sectional view of an exemplary step of forming the light-emitting element layer 5 according to the still other embodiment of the disclosure.

Each of FIGS. 23 to 25 is a schematic cross-sectional view of an exemplary step of forming the light-emitting element layer 5 (Step S4) according to the third embodiment.

The method according to the third embodiment can also form the light-emitting element layer 5 illustrated in FIG. 3.

The method according to the third embodiment may differ from the method according to the first embodiment described above. In the former embodiment, the processing P2 shown in FIG. 22 is carried out, instead of the processing P1 shown in FIG. 7, at each of Steps S24, S25, and S26. Otherwise, the method according to the third embodiment is the same as the method according to the first embodiment described above.

The processing P2 shown in FIG. 22 differs from the processing P1 shown in FIG. 7. The former processing: additionally includes a step of forming a polymer layer (Step S32, a polymer layer forming step) between Step S31 and Step S33; additionally includes a step of etching the polymer layer (Step S36, a polymer layer patterning step) between Step S35 and Step S37; includes a step of removing the PR layer and the polymer layer; and includes a step of removing a QD layer. These steps are included in the stated order instead of Step S39. Otherwise, the processing P2 illustrated in FIG. 22 is the same as the processing P1 shown in FIG. 7.

Hence, the processing P2 achieves the same advantageous effects as those of the processing P1 described above, and further achieves advantageous effects that the polymer layer protects the QD layer.

For example, described is a case where, Step S24 of forming the red light-emitting layer 35*r* carries out the processing P2 illustrated in FIG. 22.

As shown in FIGS. 22 and 23, following Step S31, a polymer material containing an uncured polymer is applied to a red QD layer, and the polymer is cured to form a polymer layer 44*r* (Step S32). Next, Steps S33 and S34 are carried out.

Subsequently, as illustrated in FIGS. 22 and 24, Step S35 is carried out. Steps S33 to S35 involve forming and patterning the negative PR layer 45*r*. As a result of this patterning, a first portion 441*r* of the polymer layer 44*r* is exposed from the negative PR layer 45*r*, and a second portion 442*r* of the polymer layer 44*r* is covered with the negative PR layer 45*r*.

Furthermore, during Step S34, the red QD layer 43*r* is completely covered with the polymer layer 44*r*. Hence, when the negative PR layer 45 is exposed to light at Step S34, light transmitted through the negative PR layer 45 is absorbed into the polymer layer 44*r*. Thanks to the absorption, the light reaching the QD layer 43 in the method according to the third embodiment is smaller in amount than the light reaching the QD layer 43 in the methods according to the first and second embodiments. As a result, damage to the QD layer 43 at Step S34 can be reduced. In order to further reduce the damage, the polymer layer 44*r* preferably contains a polymer highly capable of absorbing light in a wavelength to be used at Step S34.

At Step S35, a polymer to be contained in the polymer layer 44*r* and a developing solution for the negative PR layer 45 are preferably selected so that the polymer layer is not removed. In this case, at Step S35, the QD layer 43 is covered with the polymer layer 44*r*, and protected from the developing solution. Furthermore, the second red ligands 42*r* to be contained in the red QD layer 43*r* and the polymer to be contained in the polymer layer 44*r* are preferably selected so that the red QD layer 43*r* is not removed at Step S36 to be described later. Hence, because the developing solution of the negative PR layer 45 is a polar solvent, the polymer contained in the polymer layer is preferably a nonpolar polymer and the second ligands 42 contained in the QD layer 43 are preferably polar ligands.

Alternatively, at Step S35, a polymer to be contained in the polymer layer and a developing solution for the negative PR layer 45 are preferably selected so that the polymer layer is removed. In other words, the developing solution for the negative PR layer 45 and the etching solution for the polymer layer are preferably the same solution. Hence, because the developing solution of the negative PR layer 45 is a polar solvent, the polymer to be contained in the polymer layer is preferably a nonpolar polymer and the second ligands 42 contained in the QD layer 43 are preferably polar ligands. In this case, Steps S35 and S36 can be sequentially carried out substantially in a single process.

Next, as shown in FIGS. 22 and 25, the patterned negative PR layer 45*r* is used as a mask. Using an etchant, the polymer layer 44*r* is wet-etched (Step S36).

At Step S36, the etchant comes into contact with an upper surface of the first portion 441*r* of the polymer layer 44*r*, and dissolves the first portion 441*r*. On the other hand, the second portion 442*r* of the polymer layer 44*r* is isolated from the etchant by the cured second portion 452*r* of the negative PR layer 45*r*. Hence, the second portion 442*r* remains. As a result of this patterning, the first portion 431*r* of the red QD layer 43*r* is exposed from the polymer layer 44*r* and the negative PR layer 45*r*, and the second portion 432*r* of the red QD layer 43*r* is covered with the polymer layer 44*r* and the negative PR layer 45*r*. Hence, along the patterned negative PR layer 45*r*, the polymer layer 44*r* is also patterned.

At Step S36, the second red ligands 42*r* to be contained in the red QD layer 43*r* and the polymer to be contained in the polymer layer 44*r* are preferably selected so that the red QD layer 43*r* is not removed. That is, if the polymer is a polar polymer such as polyvinyl alcohol, polyvinyl pyrrolidone, polyethyleneimine, or polyethylene glycol, the etchant to be used is a polar solvent. That is why the second ligands 42 are preferably nonpolar ligands. Alternatively, if the polymer is a nonpolar polymer such as acrylic resin, polyethylene, or polystyrene, the etchant to be used is a nonpolar solvent such as toluene or hexane. That is why the second ligands 42 are preferably polar ligands.

Subsequently, Steps S37 and S38 are carried out. The second portion 452*r* of the patterned negative PR layer 45*r* and the second portion 442*r* of the patterned polymer layer 44*r* are removed (Step S40, a part of a removing step). Then, the second portion 432*r* (a soluble portion) of the red QD layer 43*r* is removed (Step S41, a part of the removing step). Thus, the configuration illustrated in FIG. 10 is achieved.

At Step S40, the cured second portion 452*r* of the negative PR layer 45*r* may be removed either by delamination or by decomposition. If the second portion 452*r* of the negative PR layer 45*r* is delaminated and removed, the second portion 442*r* of the polymer layer 44*r* is dissolved so that the second portion 452*r* can be delaminated and removed. If the second portion 452*r* of the negative PR layer 45*r* is decomposed and removed, the second portion 452*r* can be treated with a strong acid or ashed off to be decomposed and removed. After that, using a solution that is the same as, or different from, the developing solution, the second portion 442*r* of the polymer layer 44*r* can be removed.

Even though detailed descriptions will be omitted, the same applies to the case where the processing P2 shown in FIG. 22 is carried out at Step S25 of forming the green light-emitting layer 35*g* and Step S26 of forming the blue light-emitting layer 35*b*.

Fourth Embodiment

Another embodiment of the disclosure will be described below. Note that, for convenience in description, like reference signs designate members having identical functions throughout the first to fourth embodiments. These members will not be elaborated upon repeatedly.

Figure 26:
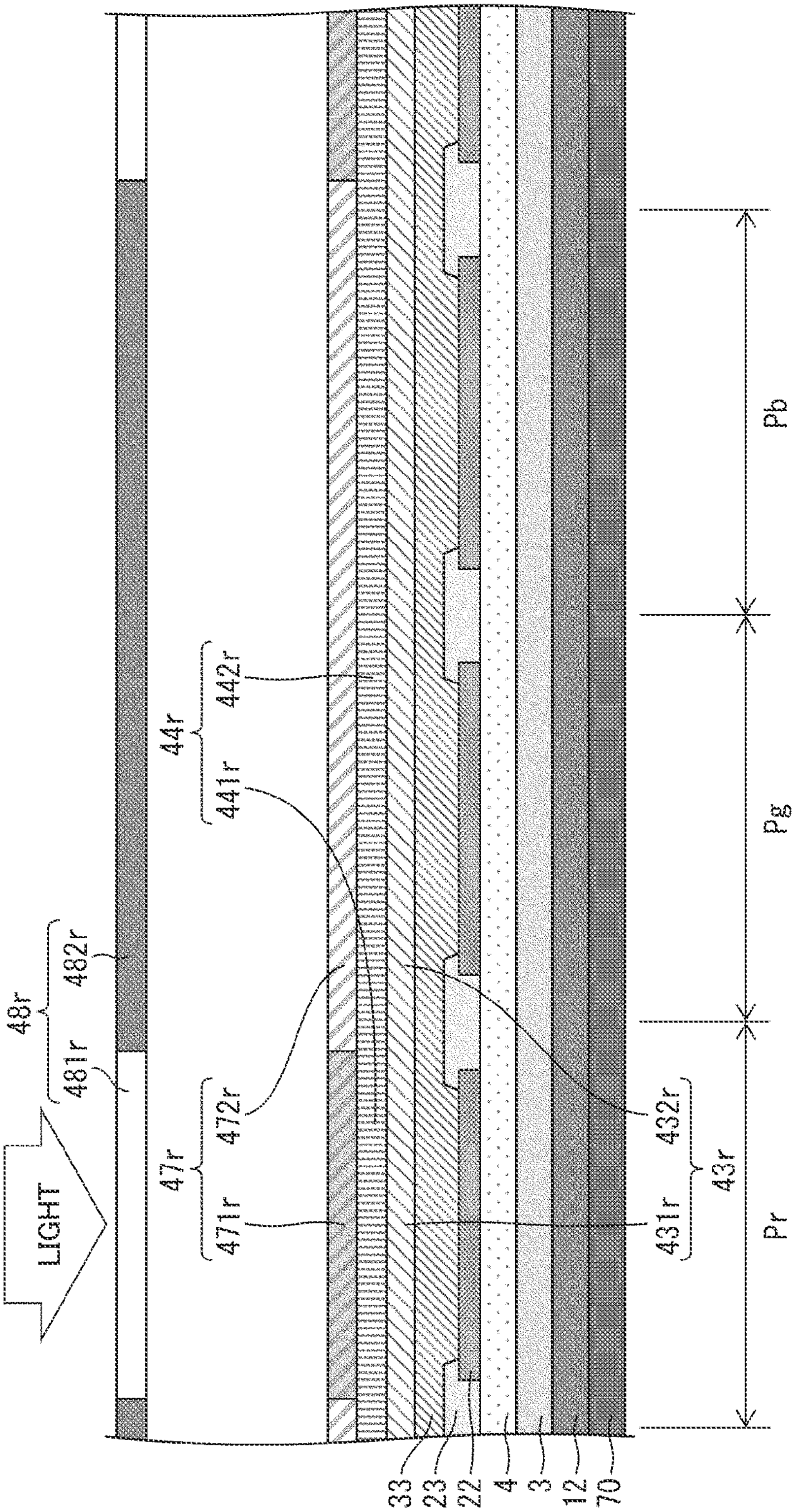
FIG. 26 is a schematic cross-sectional view of an exemplary step of forming the light-emitting element layer 5 according to still yet another embodiment of the disclosure.

FIG. 26 is a schematic cross-sectional view of an exemplary step of forming the light-emitting element layer 5 (Step S4) according to the fourth embodiment.

The method according to the fourth embodiment can also form the light-emitting element layer 5 illustrated in FIG. 3.

The method according to the fourth embodiment differs from the method according to the third embodiment. In the former method, a PR material containing a positive PR is used at Step S33 of FIG. 22, a positive mask is used at Step S34 of FIG. 22, and a developing solution is used for the positive PR at Step S35 of FIG. 22. The method according to the fourth embodiment may differ from the first embodiment described above. In the former embodiment, the positive PR layer is optionally exposed to light and removed at Step S40 of FIG. 7. Otherwise, the method according to the fourth embodiment is the same as the method according to the third embodiment described above.

For example, described is a case where, Step S24 of forming the red light-emitting layer 35*r* carries out the processing P2 shown in FIG. 22.

As shown in FIGS. 22 and 26, following step S32, the positive PR layer 47*r* is entirely formed (Step S33). Next, using a positive red mask 48*r*, the positive PR layer 47*r* is exposed to an ultraviolet ray (Step S34). Then, as illustrated in FIG. 22, the positive PR layer 47*r* is developed using a developing solution for the positive PR (Step S35).

Subsequently, Steps S37 and S38, and S40 and S41 are carried out. In the method according to the fourth embodiment, as seen at Step S39 of the method according to the second embodiment, the second portion 472*r* of the positive PR layer 47*r* may be exposed to light and removed at Step S40.

Even though detailed descriptions will be omitted, the PR material containing a positive PR, the positive mask, and the developing solution for the positive PR are also used in the case where the processing P2 shown in FIG. 22 is carried out at Step S25 of forming the green light-emitting layer 35*g* and Step S26 of forming the blue light-emitting layer 35*b*.

EXAMPLES AND COMPARATIVE EXAMPLES

Examples and a comparative example according to one embodiment of the disclosure will be described below.

Figure 27:
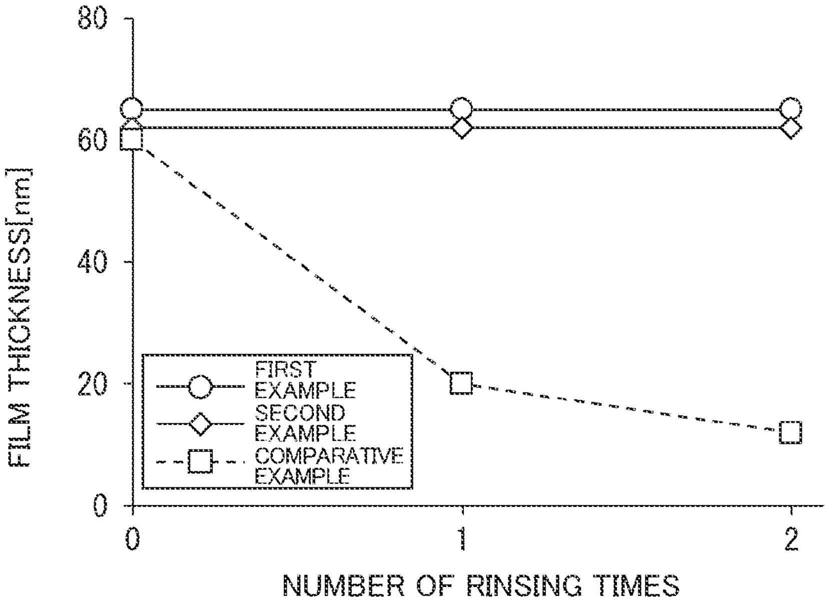
FIG. 27 is a graph illustrating a result of measuring: film thicknesses of light-emitting layers according to an example of the disclosure; and a film thickness of a light-emitting layer according to a comparative example.
Figure 28:
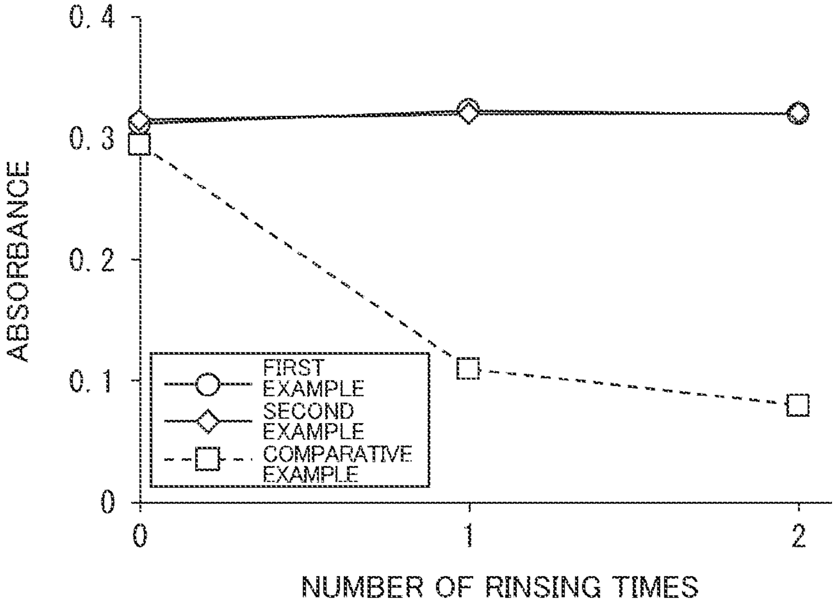
FIG. 28 is a graph illustrating a result of measuring: absorbances of light-emitting layers according to an example of the disclosure; and an absorbance of a light-emitting layer according to a comparative example.
Figure 29:
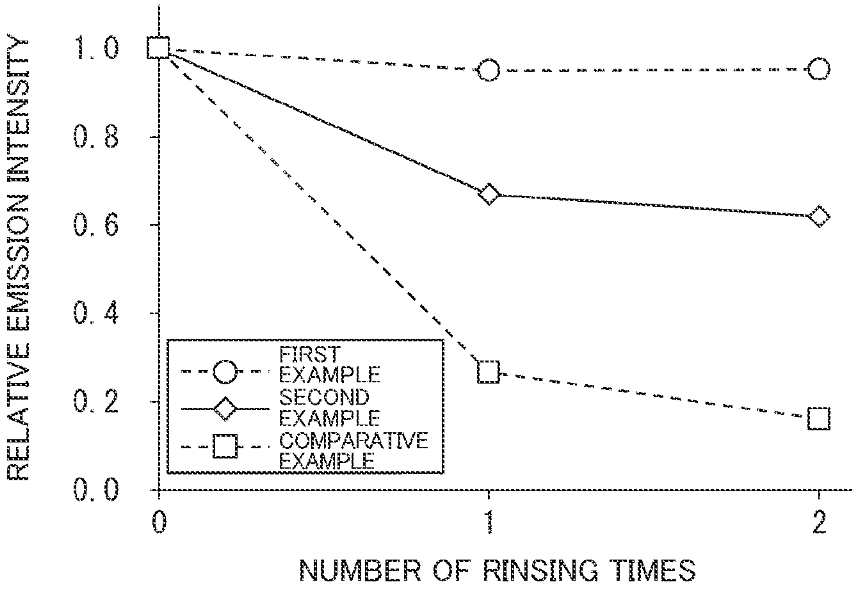
FIG. 29 is a graph illustrating a result of measuring an emission intensity of a light-emitting layer according to an example of the disclosure and an emission intensity of a light-emitting layer according to a comparative example. The measurement result is represented by a relative emission intensity where an emission intensity of each light-emitting layer before rinsing is set to 1.

FIG. 27 is a graph illustrating a result of measuring: film thicknesses of light-emitting layers according to examples of the disclosure; and a film thickness of a light-emitting layer according to a comparative example. FIG. 28 is a graph illustrating a result of measuring: absorbances of light-emitting layers according to examples of the disclosure; and an absorbance of a light-emitting layer according to a comparative example. FIG. 29 is a graph illustrating a result of measuring: emission intensities of light-emitting layers according to an example of the disclosure; and an emission intensity of a light-emitting layer according to a comparative example. The measurement result is represented by a relative emission intensity where an emission intensity of each light-emitting layer before rinsing is set to 1. In each of FIGS. 27 to 29, the horizontal axis represents the number of rinsing times, and the number of rinsing times of 0 means before rinsing.

The term "rinsing" in the examples and the comparative examples corresponds to Step S39 or Step S41. Hence, from these results, effects of Steps S39 and S41 on the light-emitting layer 35 can be estimated.

COMPARATIVE EXAMPLES

By a known method, nanoparticles (QDs) were synthesized. Each of the QDs included: a CdS core; and a 1 nm ZnSe shell, and had an emission peak wavelength of 630 nm. The surface of the QDs was modified with octanethiol represented by the structural formula (1) below. The QDs were dispersed in toluene, and a QD toluene solution was prepared. The QD toluene solution was spin-coated on a glass substrate at 2000 rpm to form a film. The glass substrate was heated to 100° C., and toluene was volatilized from the QD toluene solution film. Hence, a QD layer was obtained. This QD layer had a thickness of 60 nm or more and 65 nm or less.

[Chemical 1]

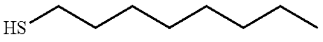

(1)

This QD layer was designated as a light-emitting layer of the comparative example. The light-emitting layer of the comparative example has the same configuration (the configuration illustrated in FIG. 5) as the configuration of the QD layer 40 according to the first to fourth embodiments described above.

The light-emitting layer of the comparative example was rinsed twice using toluene as a rinsing solution. The film thickness, the absorbance, and the emission intensity of the light-emitting layer according to the comparative example were measured three times in total before rinsing, after the first rinsing, and after the second rinsing. Here, the film thickness of the light-emitting layer is an average film thickness of a center portion of the light-emitting layer. Furthermore, the absorbance of the light-emitting layer is an absorbance for light having a wavelength of 450 nm.

Moreover, the emission intensity of the light-emitting layer is an intensity of light emitted from the light-emitting layer with a wavelength of 630 nm when the light-emitting layer is irradiated with light having the same intensity with a wavelength of 450 nm.

First Example 2,2'-(Ethylenedioxy)diethanethiol was dissolved in acetonitrile at a concentration of 0.1 mol/L, and a solution containing 2,2'-(Ethylenedioxy)diethanethiol was obtained. This solution was applied in a sufficient amount to the QD layer obtained in the comparative example (i.e., the light-emitting layer of the comparative example). Ligand exchange proceeded. In ten seconds after the application, the glass substrate was spun and heated to 100° C. The ligand exchange was completed.

The QD layer after the ligand exchange was used as the light-emitting layer of a first example. 2,2'-(Ethylenedioxy) diethanethiol is a compound represented by the structural formula (2) below, and has two coordinating functional groups. Hence, the light-emitting layer of the first example has the same configuration (the configuration illustrated in FIG. 4) as the configuration of the light-emitting layer 35 according to the first to fourth embodiments described above.

[Chemical 2]

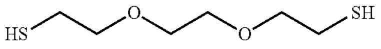

(2)

The light-emitting layer of the first example was washed twice in the same manner as in the comparative example.

The film thickness, absorbance, and emission intensity of the light-emitting layer were measured.

Second Example 1,2-Ethanedithiol was dissolved in acetonitrile at a concentration of 0.1 mol/L, and a solution containing 2,2'-1,2-Ethanedithiol was obtained. This solution was applied in a sufficient amount to the QD layer obtained in the comparative example (i.e., the light-emitting layer of the comparative example). Ligand exchange proceeded. In ten seconds after the application, the glass substrate was spun and heated to 100° C. The ligand exchange was completed.

The QD layer after the ligand exchange was used as the light-emitting layer of a second example. 1,2-Ethanedithiol is a compound represented by the structural formula (3) below, and has two coordinating functional groups. Hence, the light-emitting layer according to the second example has the same configuration (the configuration illustrated in FIG. 4) as the configuration of the light-emitting layer 35 according to the first to fourth embodiments described above.

[Chemical 3]

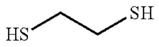

(3)

The light-emitting layer of the second example was washed twice in the same manner as in the comparative example. The film thickness, absorbance, and emission intensity of the light-emitting layer were measured.

As shown in FIGS. 27 to 29, compared with the light-emitting layer according to the comparative example, the light-emitting layers according to the first and second examples withstood rinsing and each maintained the film thickness, the absorbance, and the emission intensity. This is because the QDs in the light-emitting layers according to the first and second examples bond together through the first ligands. Hence, the light-emitting layer preferably contains the first ligands each having a plurality of coordinating functional groups.

As shown in FIGS. 27 to 29, compared with the light-emitting layer according to the first example, the light-emitting layer according to the second example exhibited reduction in emission intensity as the rinsing proceeded. This is because the QDs in the light-emitting layer according to the second example bond together through the first ligands represented by the structural formula (3), so that the QDs are easily deactivated. Hence, the first ligands are preferably selected so that the surface-to-surface distance is sufficiently kept between QDs bonding together through the first ligands. Specifically, the first ligands preferably bond through carbon having two or more coordinating functional groups.

Summary

A method for manufacturing an EL element according to a first aspect of the disclosure includes: a first quantum dot layer forming step of forming a quantum dot layer containing first quantum dots; a first quantum dot layer coating step of exposing a first portion included in the first quantum dot layer, and coating a second portion included in the first quantum dot layer other than the first portion, the first quantum dot layer coating step including: a photoresist layer forming step of forming, on the first quantum dot layer, a photoresist layer including a photoresist; and a photoresist layer patterning step of partially exposing the photoresist layer with light, developing the photoresist layer, and patterning the photoresist layer; a solution supplying step of applying or spraying a solution only to or on the first portion of the first quantum dot layer, the solution containing first molecules each having a plurality of coordinating functional groups coordinatable with the first quantum dots and; a removing step of removing the second portion of the first quantum dot layer and the patterned photoresist layer, such that the first portion of the first quantum dot layer forms a first light-emitting layer.

The method for manufacturing the EL element according to a second aspect of the disclosure relates to the first aspect. The solution supplying step may allow the first molecules to permeate through the first portion of the first quantum dot layer, such that the first portion of the first quantum dot layer becomes insoluble, and the removing step may involve removing the second portion of the first quantum dot layer and the patterned photoresist layer, such that the insoluble first portion of the first quantum dot layer forms the first light-emitting layer.

The method for manufacturing the EL element according to a third aspect of the disclosure relates to the first or second aspect. The first quantum dot layer coating step may further include: a polymer layer forming step of forming a polymer layer on the first quantum dot layer, the polymer layer forming step preceding the photoresist layer forming step; and a polymer layer patterning step of patterning the polymer layer along the patterned photoresist layer, the polymer layer patterning step succeeding the photoresist patterning step. The photoresist layer forming step may involve forming the photoresist layer on the first quantum dot layer and the polymer layer.

The method for manufacturing the EL element according to a fourth aspect of the disclosure relates to the third aspect. The first quantum dot layer forming step may involve forming the first quantum dot layer further containing second molecules each having only one coordinating functional group coordinatable with the first quantum dots. The second molecules may be polar molecules. The polymer layer may contain a nonpolar polymer.

The method for manufacturing the EL element according to a fifth aspect of the disclosure relates to the third aspect. The first quantum dot layer forming step may involve forming the first quantum dot layer further containing second molecules each having only one coordinating functional group coordinatable with the first quantum dots. The second molecules may be nonpolar molecules. The polymer layer may contain a polar polymer The method for manufacturing the EL element according to a sixth aspect of the disclosure relates to any one of the first to fifth aspects. The photoresist may be a curable photoresist that cures when irradiated with light. The photoresist layer patterning step may involve exposing, with light, a portion of the photoresist layer, the portion corresponding to the second portion of the first quantum dot layer.

The method for manufacturing the EL element according to a seventh aspect of the disclosure relates to any one of the first to fifth aspects. The photoresist may be a decomposable photoresist when irradiated with light. The photoresist layer patterning step may involve exposing, with light, a portion of the photoresist layer, the portion corresponding to the first portion of the first quantum dot layer.

The method for manufacturing the EL element according to an eighth aspect of the disclosure relates to any one of the first to seventh aspects. In the first light-emitting layer, the first quantum dots may bond together through the first molecules.

The method for manufacturing the EL element according to a ninth aspect of the disclosure relates to the eighth aspect. A surface-to-surface distance may be 0.5 nm or more and 3 nm or less between the first quantum dots bonding together through the first molecules.

The method for manufacturing the EL element according to a tenth aspect of the disclosure relates to any one of the first to ninth aspects. The plurality of coordinating functional groups may include thiol groups. The thiol groups may bond together through two or more carbons.

The method for manufacturing the EL element according to an eleventh aspect of the disclosure relates to any one of the first to tenth aspects. The method may further include a second quantum dot forming step of forming a second quantum dot layer containing second quantum dots that emit light a color of which is different from a color of light emitted from the first quantum dots, the second quantum dot forming step succeeding the removing step.

The method for manufacturing the EL element according to a twelfth aspect of the disclosure relates to the eleventh aspect. The second quantum dot layer forming step may involve forming the second quantum dot layer to cover the first light-emitting layer.

An EL element according to a thirteenth aspect of the present disclosure includes: a first light-emitting layer that emits light in a first color in a first direction; and a second light-emitting layer positioned in a second direction intersecting with the first direction with respect to the first light-emitting layer, the second light-emitting layer emitting light in a second color in the first direction. The first light-emitting layer contains: first quantum dots that emit the light in the first color; and molecules each having a plurality of coordinating functional groups coordinatable with the first quantum dots. The second light-emitting layer contains: second quantum dots that emit the light in the second color; and fourth molecules each having a plurality of coordinating functional groups coordinatable with the second quantum dots.

The EL element according to a fourteenth aspect relates to the thirteenth aspect. An average thickness of an end portion of the first light-emitting layer may be 80% or more and 120% or less of an average thickness of a center portion of the first light-emitting layer. An average thickness of an end portion of the second light-emitting layer may be 80% or more and 120% or less of an average thickness of a center portion of the second light-emitting layer.

The EL element according to a fifteenth aspect of the disclosure relates to the thirteenth or fourteenth aspect. In the first light-emitting layer, the first quantum dots may bond together through the molecules. A surface-to-surface distance may be 0.5 nm or more and 3 nm or less between the first quantum dots bonding together through the molecules.

The EL element according to a sixteenth aspect of the disclosure relates to any one of the thirteenth to fifteenth aspect. The plurality of coordinating functional groups of the molecules of the first light-emitting layer may include thiol groups. The thiol groups may bond together through two or more carbons.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined together to achieve a new technical feature.

The disclosure is applicable not only to a light-emitting layer but also to a carrier transport layer containing metal oxide nanoparticles.

The methods according to the first to fourth embodiments can be selectively combined with one another in any given manner. For example, among P light-emitting elements, light-emitting layers with Q light-emitting elements may be patterned using a PR material containing a negative PR, and light-emitting layers with (P−Q) light-emitting elements may be patterned using a PR material including a positive PR. For example, among the P light-emitting elements, light-emitting layers with R light-emitting elements may be patterned without using a polymer layer, and light-emitting layers with (P−R) light-emitting elements may be patterned using a polymer layer. Here, P is an integer of 2 or more, Q is an integer of 1 or more and (P−1) or less, and R is an integer of 1 or more and (P−1) or less.

The invention claimed is:

1. A method for manufacturing an electroluminescent (EL) element, the method comprising:

forming a first quantum dot layer containing first quantum dots;

exposing a first portion of the first quantum dot layer, and coating a second portion, different from the first portion, of the first quantum dot layer, the first quantum dot layer coating comprising:

forming a polymer layer on the first quantum dot layer, forming, on the first quantum dot layer, a photoresist layer, including a photoresist, by forming the photoresist layer on the first quantum dot layer and the polymer layer, wherein the polymer layer is formed before forming the photoresist layer, partially exposing the photoresist layer with light, developing the photoresist layer, and patterning the photoresist layer, and;

patterning the polymer layer along the patterned photoresist layer, wherein the polymer layer is patterned after patterning the photoresist layer;

applying or spraying a solution only to or on the first portion of the first quantum dot layer, the solution containing first molecules, each having a plurality of coordinating functional groups coordinatable with the first quantum dots; and removing the second portion of the first quantum dot layer and the patterned photoresist layer, such that the first portion of the first quantum dot layer forms a first light-emitting layer.

2. The method for manufacturing the EL element according to claim 1, wherein:

applying or spraying the solution allows the first molecules to permeate through the first portion of the first quantum dot layer, such that the first portion of the first quantum dot layer becomes insoluble, and removing the second portion of the first quantum dot layer and the patterned photoresist layer comprises removing the second portion of the first quantum dot layer and the patterned photoresist layer, such that the insoluble first portion of the first quantum dot layer forms the first light-emitting layer.

3. The method for manufacturing the EL element according to claim 1, wherein:

forming the first quantum dot layer comprises forming the first quantum dot layer, such that the first quantum dot layer further contains second molecules, each having only one coordinating functional group coordinatable with the first quantum dots,
the second molecules are polar molecules, and
the polymer layer contains a nonpolar polymer.

4. The method for manufacturing the EL element according to claim 1, wherein:
forming the first quantum dot layer comprises forming the first quantum dot layer, such that the first quantum dot layer further contains second molecules, each having only one coordinating functional group coordinatable with the first quantum dots,
the second molecules are nonpolar molecules, and
the polymer layer contains a polar polymer.

5. The method for manufacturing the EL element according to claim 1, wherein:
the photoresist is a curable photoresist that cures when irradiated with light, and
patterning the photoresist layer comprises exposing, with light, a portion of the photoresist layer corresponding to the second portion of the first quantum dot layer.

6. The method for manufacturing the EL element according to claim 1, wherein:
the photoresist is a decomposable photoresist that decomposes when irradiated with light, and
patterning the photoresist layer comprises exposing, with light, a portion of the photoresist layer corresponding to the first portion of the first quantum dot layer.

7. The method for manufacturing the EL element according to claim 1, wherein, in the first light-emitting layer, the first quantum dots bond together through the first molecules.

8. The method for manufacturing the EL element according to claim 1, wherein:
the plurality of coordinating functional groups includes a plurality of thiol groups, and
the plurality of thiol groups bonds together through two or more carbons.

9. The method for manufacturing the EL element according to claim 1, further comprising:
forming a second quantum dot layer containing second quantum dots that emit light, a color of which is different from a color of light emitted from the first quantum dots, wherein the second quantum dot layer is formed after removing the second portion of the first quantum dot layer and the patterned photoresist layer.

10. The method for manufacturing the EL element according to claim 9, wherein forming the second quantum dot layer comprises forming the second quantum dot layer so as to cover the first light-emitting layer.

11. An electroluminescent (EL) element, comprising:
a first light-emitting layer configured to emit light in a first color in a first direction; and
a second light-emitting layer positioned in a second direction intersecting the first direction with respect to the first light-emitting layer, the second light-emitting layer configured to emit light in a second color in the first direction,
wherein the first light-emitting layer contains:
first quantum dots configured to emit the light in the first color; and
first molecules, each having a plurality of coordinating functional groups coordinatable with the first quantum dots, and
the second light-emitting layer contains:
second quantum dots configured to emit the light in the second color; and
second molecules, each having a plurality of coordinating functional groups coordinatable with the second quantum dots.

12. The EL element according to claim 11,
wherein an average thickness of an end portion of the first light-emitting layer is 80% or more and 120% or less of an average thickness of a center portion of the first light-emitting layer, and
an average thickness of an end portion of the second light-emitting layer is 80% or more and 120% or less of an average thickness of a center portion of the second light-emitting layer.

13. The EL element according to claim 11,
wherein, in the first light-emitting layer, the first quantum dots bond together through the first molecules, and
a surface-to-surface distance between the first quantum dots bonding together through the first molecules is 0.5 nm or more and 3 nm or less.

14. The EL element according to claim 11, wherein:
the plurality of coordinating functional groups of the first molecules of the first light-emitting layer includes a plurality of thiol groups, and
the plurality of thiol groups bonds together through two or more carbons.

15. A method for manufacturing an electroluminescent (EL) element, comprising:
forming a first quantum dot layer containing first quantum dots;
exposing a first portion of the first quantum dot layer, and coating a second portion, different from the first portion, of the first quantum dot layer, the first quantum dot layer coating comprising:
forming, on the first quantum dot layer, a photoresist layer, including a photoresist; and
partially exposing the photoresist layer with light, developing the photoresist layer, and patterning the photoresist layer;
applying or spraying a solution only to or on the first portion of the first quantum dot layer, the solution containing first molecules, each having a plurality of coordinating functional groups coordinatable with the first quantum dots; and
removing the second portion of the first quantum dot layer and the patterned photoresist layer, such that the first portion of the first quantum dot layer forms a first light-emitting layer,
wherein, in the first light-emitting layer, the first quantum dots bond together through the first molecules, and a surface-to-surface distance between the first quantum dots bonding together through the first molecules is 0.5 nm or more and 3 nm or less.

16. The method for manufacturing the EL element according to claim 15,
wherein the photoresist is a curable photoresist that cures when irradiated with light, and
patterning the photoresist layer comprises exposing, with light, a portion of the photoresist layer corresponding to the second portion of the first quantum dot layer.

17. The method for manufacturing the EL element according to claim 15,
wherein the photoresist is a decomposable photoresist that decomposes when irradiated with light, and
patterning the photoresist layer comprises exposing, with light, a portion of the photoresist layer corresponding to the first portion of the first quantum dot layer.

18. The method for manufacturing the EL element according to claim 15, wherein the plurality of coordinating functional groups includes a plurality of thiol groups, and the plurality of thiol groups bonds together through two or more carbons.

19. The method for manufacturing the EL element according to claim 15, further comprising:

forming a second quantum dot layer containing second quantum dots that emit light, a color of which is different from a color of light emitted from the first quantum dots, wherein the second quantum dot layer is formed after removing the second portion of the first quantum dot layer and the patterned photoresist layer.

20. The method for manufacturing the EL element according to claim 19, wherein forming the second quantum dot layer comprises forming the second quantum dot layer so as to cover the first light-emitting layer.

* * * * *